(12) United States Patent
Sasaki et al.

(10) Patent No.: US 8,426,929 B2
(45) Date of Patent: Apr. 23, 2013

(54) SPIN TRANSPORT TYPE MAGNETIC SENSOR

(75) Inventors: Tomoyuki Sasaki, Tokyo (JP); Tohru Oikawa, Tokyo (JP); Kiyoshi Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 13/396,062

(22) Filed: Feb. 14, 2012

(65) Prior Publication Data

US 2012/0211848 A1    Aug. 23, 2012

(30) Foreign Application Priority Data

Feb. 23, 2011    (JP) ................................ P2011-037552

(51) Int. Cl.
  *H01L 27/14*    (2006.01)
(52) U.S. Cl.
  USPC .............................................. 257/414; 438/3
(58) Field of Classification Search ...... 438/3; 257/422, 257/414, 427, 232, 233, 234
  See application file for complete search history.

(56) References Cited

U.S. PATENT DOCUMENTS

| | | | | |
|---|---|---|---|---|
| 6,826,022 | B2 * | 11/2004 | Umetsu | 360/324.12 |
| 6,998,688 | B2 * | 2/2006 | De Jongh et al. | 257/414 |
| 7,745,810 | B2 * | 6/2010 | Rueckes et al. | 257/4 |
| 7,782,576 | B2 * | 8/2010 | Uesugi et al. | 360/324.11 |
| 7,969,692 | B2 | 6/2011 | Takahashi | |
| 2003/0030948 | A1 * | 2/2003 | Umetsu | 360/324.12 |
| 2008/0043370 | A1 * | 2/2008 | Hirata et al. | 360/110 |
| 2008/0273274 | A1 * | 11/2008 | Kojima et al. | 360/315 |
| 2010/0044680 | A1 * | 2/2010 | Hong et al. | 257/37 |
| 2011/0204886 | A1 | 8/2011 | Sasaki et al. | |

FOREIGN PATENT DOCUMENTS

| | | |
|---|---|---|
| JP | A-2007-299467 | 11/2007 |
| JP | A-2010-37362 | 2/2010 |
| JP | A-2011-176012 | 9/2011 |

OTHER PUBLICATIONS

Sasaki et al., "Evidence of Electrical Spin Injection Into Silicon Using MgO Tunnel Barrier," *IEEE Transactions on Magnetics*, vol. 46, No. 6, Jun. 2010, pp. 1436-1439.
Sasaki et al., "Temperature dependence of spin diffusion length in silicon by Hanle-type spin precession," *Applied Physics Letters*, Mar. 22, 2010, vol. 96, pp. 122101-1 through 122101-3.
Suzuki et al., "Room-Temperature Electron Spin Transport in a Highly Doped Si Channel," *Applied Physics Express*, vol. 4, Feb. 7, 2011, pp. 023003-1 through 023003-3.
U.S. Appl. No. 13/227,135, filed Sep. 7, 2011 in the name of Tomoyuki Sasaki et al.

* cited by examiner

*Primary Examiner* — Thao P. Le
(74) *Attorney, Agent, or Firm* — Oliff & Berridge, PLC

(57) ABSTRACT

The magnetic sensor includes a base substrate having a magnetic shield layer; a single-domain semiconductor crystal layer attached via an insulating film on the magnetic shield layer of the base substrate; a first ferromagnetic layer formed on top of the semiconductor crystal layer on the opposite side of the semiconductor crystal layer to the insulating film, via a first tunnel barrier layer; and a second ferromagnetic layer formed, at a distance from the first ferromagnetic layer, on top of the semiconductor crystal layer on the opposite side of the semiconductor crystal layer to the insulating film, via a second tunnel barrier layer.

11 Claims, 19 Drawing Sheets

SPIN TRANSPORT TYPE MAGNETIC SENSOR

BACKGROUND OF THE INVENTION

1. Field of the Invention

The present invention relates to a magnetic sensor utilizing the rotation of spins by external magnetic fields, particularly to a spin transport type magnetic sensor.

2. Related Background Art

Magnetic heads of hard disk drives (HDDs) are magnetic sensors utilizing magnetoresistance effects. Tunnel magnetoresistance (TMR) devices used for magnetic heads have a spin-valve structure and have a superior property that it can provide relatively significant change in output. However, it is believed that, when an improvement in magnetic data readout speed is required, especially readout of magnetic data having a record density of 1 Tbit/inch or more is required, a different detection principle of magnetic heads needs to be applied in order to detect the magnetic data.

In order to address such problem, the present applicant have proposed a spin transport type magnetic sensor utilizing a spin current flowing through a semiconductor layer in a SOI (Silicon on Insulator) substrate (see Japanese Patent Application Laid-Open. No. 2011-176012). Generally, Si has a spin diffusion length of 1 μm or less and a spin lifetime of 1 nsec or less.

However, there is still a room for improvement in spin transport properties of spin transport type magnetic sensors using SOI substrates. With the foregoing in view, it is an object of the present mode to provide a spin transport type magnetic sensor which can improve spin transport properties.

SUMMARY OF THE INVENTION

According to an extensive study carried out by the resent inventors on spin transport properties of spin transport type magnetic sensors, it has been found that a semiconductor crystal layer does not have sufficient crystallinity when it is grown on an insulating layer such as SiOx or MgO, affecting spin transport properties.

Accordingly, a magnetic sensor according to the present mode is characterized in that it comprises a base substrate having a magnetic shield layer; a single-domain semiconductor crystal layer attached via an insulating film on the magnetic shield layer of the base substrate; a first ferromagnetic layer formed on top of the semiconductor crystal layer on the opposite side of the semiconductor crystal layer to the insulating film, via a first tunnel barrier layer; and a second ferromagnetic layer formed, at a distance from the first ferromagnetic layer, on top of the semiconductor crystal layer on the opposite side of the semiconductor crystal layer to the insulating film, via a second tunnel barrier layer.

Thus, the semiconductor crystal layer is not formed by thin film growth on the an insulating layer, but is obtained by slicing or exfoliating a single crystal such as an ingot which has been separately prepared by a method for obtaining a single domain crystal such as CZ (Czochralski) or FZ (Floating Zone) method. In this case, the crystallinity of the semiconductor crystal layer is higher than that of a semiconductor crystal layer formed on an insulating layer by thin film growth. Thus, a spin transport layer utilizing this semiconductor crystal layer can provide improved spin transport properties, improved output, improved magnetic field resolution, and less limitation in production of devices. In addition, the magnetic shield layer can suppress introduction of magnetic fields into the crystal layer from outside of the base substrate.

The semiconductor crystal layer is preferably made of Si, Ge, GaAs or Graphene, which can provide a single-domain crystal.

Spins present between the first ferromagnetic layer and the second ferromagnetic layer are affected by a magnetic field introduced to the semiconductor crystal layer and rotate, thus output on the side of the second ferromagnetic layer fluctuates. Output on the side of the second ferromagnetic layer can be detected by a magnetoresistance effect measuring method and a spin current method.

In the magnetoresistance effect measuring method, the magnitude of the magnetic field introduced to the semiconductor crystal layer can be measured by flowing electrons between the first ferromagnetic layer and the second ferromagnetic layer and measuring a change in magnetoresistance therebetween.

When electrons are caused to flow between the first and second ferromagnetic layers, spins thereof rotate by the effect of the magnetic field and output fluctuates. As the semiconductor crystal layer is bulk, its crystallinity is higher than that of a semiconductor crystal layer of a SOI substrate prepared by crystal growth. Accordingly, spin transport properties can be improved, allowing more accurate measurements.

In order to further improve data readout speed as described above, the spin current method is used.

Namely, the magnetic sensor according to the present mode is characterized in that it further comprises a first electrode which is provided on the semiconductor crystal layer on the opposite side of the semiconductor crystal layer to the insulating film and allows electrons to flow between the first electrode and the first ferromagnetic layer, and a second electrode which is provided on the semiconductor crystal layer on the opposite side of the semiconductor crystal layer to the insulating film and used for measuring voltage between the second ferromagnetic layer.

According to the spin current method, an electron flow is applied between the first ferromagnetic layer and the first electrode. In this case, a spin current diffuses from the semiconductor crystal layer immediately below the first ferromagnetic layer. The spin current is transmitted through the semiconductor crystal layer as a channel layer and reaches to the side of the second ferromagnetic layer. According to the magnetic field which is applied to spins during transmission of the spin current, the direction of the spins rotates and voltage between the second ferromagnetic layer and the second electrode fluctuates. Thus, the magnitude of the magnetic field introduced in the semiconductor crystal layer can be measured.

Specifically, when electrons are caused to flow between the first ferromagnetic layer and the first electrode, spins are accumulated in the semiconductor crystal layer, which then diffuse toward the second ferromagnetic layer. According to the polarization direction of the diffused spins, voltage between the second ferromagnetic layer and the second electrode fluctuates. In the spin transport type magnetic sensor having such structure, a magnetic field is introduced to the semiconductor crystal layer from a magnetic recording medium facing to an air bearing surface (ABS) to rotate polarization of spins during their transmission. Thus, output voltage depends on the magnitude of the magnetic field introduced in the semiconductor crystal layer, and the magnetic sensor function is provided. As the semiconductor crystal layer is bulk, its crystallinity is higher than that of a semiconductor crystal layer of a SOI substrate prepared by crystal growth. Accordingly, spin transport properties can be improved, allowing more accurate measurements.

The semiconductor crystal layer is characterized in that it has a protruding part whose tip is located on the side of an air bearing surface of a magnetic head. In this case, the magnetic field can be introduced to the semiconductor crystal layer through the protruding part.

Particularly in case the effect of the magnetic field is desired to be avoided in the semiconductor crystal layer except for the protruding part, the magnetic sensor preferably comprises, on the base substrate on the side of the air bearing surface, a magnetic shield having a through-hole in which the protruding part exists, and the through-hole is preferably located on a side face of the semiconductor crystal layer corresponding to a region between the first ferromagnetic layer and the second ferromagnetic layer. As the magnetic shield is located on the side face of the semiconductor crystal layer, the magnetic field is only introduced from the protruding part, allowing accurate measurements.

The first and second tunnel barrier layers are characterized in that they are made of $MgO$, $Al_2O_3$, $SiO_2$, $ZnO$ or $MgAl_2O_4$. These materials are advantageous due to high efficacy of spin injection and detection.

The first and second tunnel barrier layers are characterized in that they are each formed of a Schottky barrier formed at an interface of the semiconductor substrate and a metal layer Schottky-contacting thereto. The tunnel barrier layers constitute potential barriers having a thickness that allows tunneling of electrons, which is 2 nm or less according to the present example. Electrons can tunnel insulating films or Schottky barriers having a thickness of 2 nm or less. Insulating films are superior to Schottky barriers because the thickness thereof can be more easily controlled.

The thickness of the semiconductor crystal layer is 0.4 nm or more and 70 nm or less. In this case, background voltage can be lowered. Namely, it is advantageous to decrease the thickness of the semiconductor crystal layer in the magnetic sensor. A semiconductor crystal layer having a low thickness prepared on an insulating layer by crystal growth does not have sufficient crystallinity. On the other hand, when the bulk semiconductor crystal layer having a low thickness is used, noise can be sufficiently reduced due to its high crystallinity.

It is preferable that the magnetization directions of the first ferromagnetic layer and the second ferromagnetic layer are opposite to each other (anti-parallel) in the magnetoresistance effect measuring method, because the rate of change of the amount of spins reaching to the second ferromagnetic layer in response to the change in the magnetic field is increased compared to the case when they are parallel, resulting in increased output.

It is preferable that the magnetization directions of the first ferromagnetic layer and the second ferromagnetic layer are the same (parallel) in the spin current method, because the magnetization directions can be fixed by heating while applying a magnetic field simultaneously.

As channel materials, semiconductors having a cubic diamond structure such as Si or a zincblende structure such as GaAs are preferable because many bulk crystals with good quality are produced and are commercially available.

According to the present mode, the spin transport type magnetic sensor which can improve spin transport properties can be provided.

DESCRIPTION OF THE PREFERRED EMBODIMENTS

Magnetic sensors according to the aspects are illustrated hereinafter. The same component is designated with the same symbol, and redundant symbols are omitted.

Figure 1:
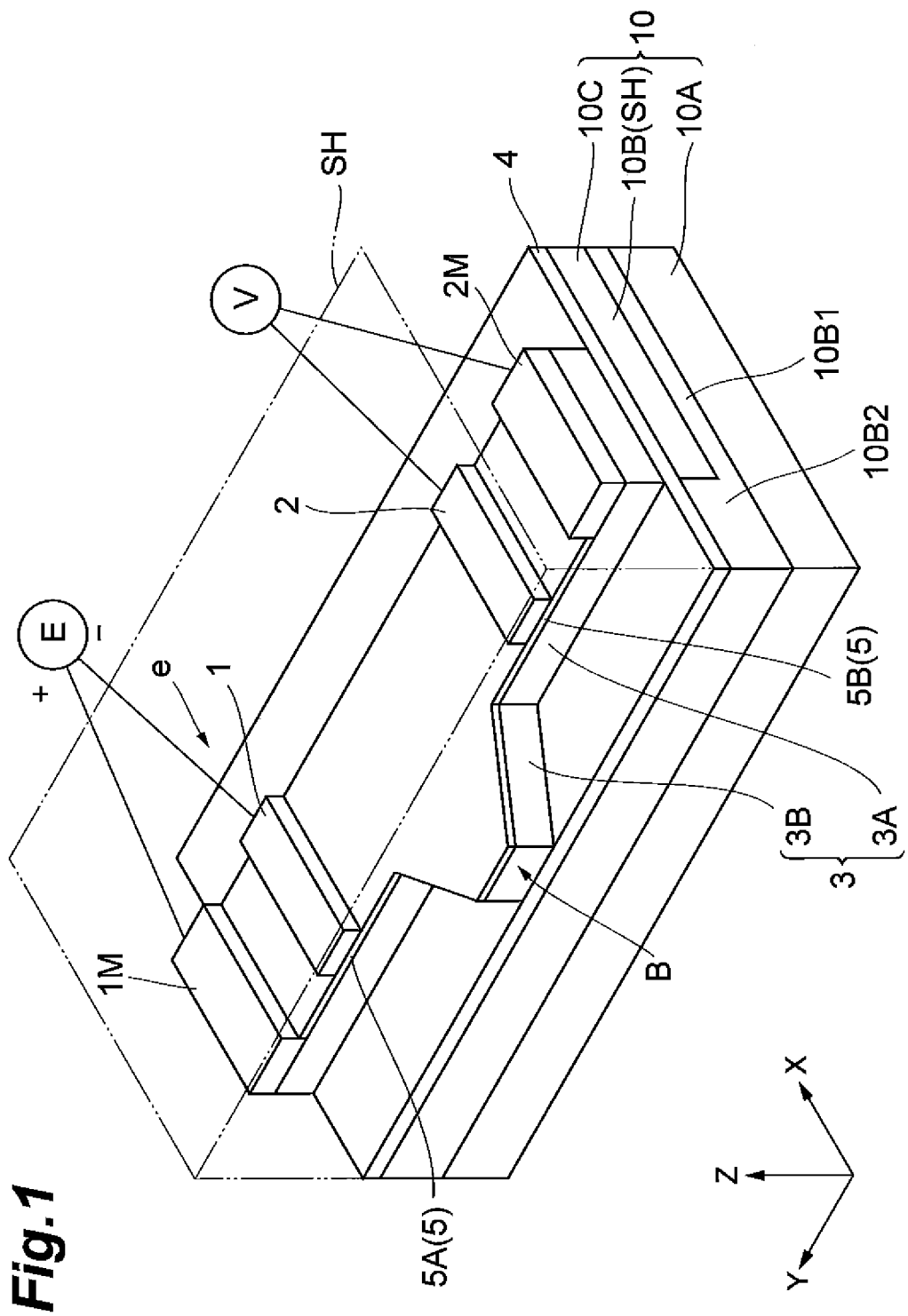
FIG. 1 is a perspective view of main parts of a magnetic sensor.

FIG. 1 is a perspective view of main parts of a magnetic sensor.

The magnetic sensor comprises a base substrate 10 and a single-domain bulk semiconductor crystal layer 3 attached via an insulating film 4 to the base substrate 10. The base substrate 10 comprises a lower base substrate 10A, a lower magnetic shield 10B and an upper base substrate 10C, which are stacked one over another. On top of the semiconductor crystal layer 3 on the opposite side of the semiconductor crystal layer 3 to the insulating film 4, a first ferromagnetic layer 1 is formed via a first tunnel barrier layer 5A, while similarly on top of the semiconductor crystal layer 3 on the opposite side of the semiconductor crystal layer 3 to the insulating film 4, a second ferromagnetic layer 2 is formed via a second tunnel barrier layer 5B. The second ferromagnetic layer 2 is provided at a distance from the first ferromagnetic layer 1 in the Y-axis direction. The magnetic shield 10B suppresses an introduction of a magnetic field from the outside of the base substrate 10 to the crystal layer 3, a magnetic shield SH1 suppresses an introduction of a magnetic field from the side of an air bearing surface to the crystal layer 3, and a magnetic shield SH2 suppresses an introduction of a magnetic field to the crystal layer 3 from the opposite side of the base substrate 10 to the magnetic shield 10B (See FIG. 14).

A three-dimensional orthogonal coordinate system is created with a thickness direction of the substrate on Z-axis, and two axes perpendicular to the Z-axis on X- and Y-axes.

The longitudinal directions of the first ferromagnetic layer 1 and the second ferromagnetic layer 2 are both along the X-axis and their magnetization directions are both oriented to the positive direction of the Y-axis (parallel). The magnetic sensor of course operates even when the magnetization directions are opposite to each other (anti-parallel).

A first electrode 1M is provided on the semiconductor crystal layer 3 on the opposite side of the semiconductor crystal layer 3 to the insulating film 4, which is provided for allowing electrons to flow between the first ferromagnetic layer 1 and the first electrode 1M. Similarly, a second electrode 2M is provided on the semiconductor crystal layer 3 on the opposite side of the semiconductor crystal layer 3 to the insulating film 4, which is provided for measuring voltage between the second ferromagnetic layer 2 and the second electrode 2. The first electrode 1M and the second electrode 2M directly contact to the semiconductor crystal layer 3.

The semiconductor crystal layer 3 is not formed by thin film growth on the insulating layer. The semiconductor crystal layer 3 is a sliced single crystal ingot prepared by CZ (Czochralski) or FZ (Floating Zone) method. The semiconductor crystal layer 3 may be thinned by optionally polishing the ingot after attachment. Namely, in order to prepare the crystal layer 3 from a single crystal of a single domain, the crystal layer 3 is prepared in a separate step without crystal growth on the insulating layer and is attached to the base substrate 10 via the insulating film 4. The separate step may be crystal growth utilizing MBE method. In crystal growth utilizing MBE method, Graphene may be employed, for example. It is known that multiple monoatomic layers of graphene are stacked to form graphite and single graphene functions as a semiconductor. Thus, an original crystal layer of graphite is formed in a separate step, which is then attached to the base substrate 10 via the insulating film 4. The original crystal layer is then exfoliated so as to leave a monatomic graphene layer on the insulating film 4 as the crystal layer 3.

The crystallinity of the bulk semiconductor crystal layer is higher than that of a semiconductor crystal layer formed on the insulating film by thin film growth. Thus, the spin transport layer utilizing the semiconductor crystal layer 3 can provide improved spin transport properties, improved output, improved magnetic field resolution, and less limitation in production of devices.

The direction of spins present between the first ferromagnetic layer 1 and the second ferromagnetic layer 2 rotates by an effect of a magnetic field B introduced to the semiconductor crystal layer 3, thereby fluctuating output voltage on the side of the second ferromagnetic layer 2. Output on the side of the second ferromagnetic layer 2 can be detected by (1) a magnetoresistance effect measuring method and (2) a spin current method.

(1) In the magnetoresistance effect measuring method, the first electrode 1M and second electrode 2M are not used. Thus, they are not formed or not used when they are formed. In this case, an electron flow source is connected between the first ferromagnetic layer 1 and the second ferromagnetic layer 2 in order to supply an electron flow therebetween. The polarized direction of spins of injected electrons rotates according to the direction of a magnetic field B introduced internally through a protruding portion 3B of the semiconductor crystal layer 3. Accordingly, the amount of electrons reaching to the second ferromagnetic layer 2 from the first ferromagnetic layer 1, in other words, the polarizability is changed, and the magnetoresistance in the region comprising the semiconductor crystal layer between these layers is changed. Thus, by measuring voltage between the first ferromagnetic layer 1 and the second ferromagnetic layer 2 by a voltage measuring circuit, the magnitude of the magnetic field B introduced in the semiconductor crystal layer 3 can be measured.

As described above, when electrons are caused to flow between the first ferromagnetic layer 1 and the second ferromagnetic layer 2, their spins rotate by means of the magnetic field B, resulting in fluctuation of output. As the semiconductor crystal layer 3 is bulk, its crystallinity is higher than that of a semiconductor crystal layer of a SOI substrate prepared by crystal growth. Accordingly, spin transport properties can be improved, allowing more accurate measurements.

In order to further improve data readout speed, the spin current method is used.

(2) In the spin current method, as shown in FIG. 1, the first electrode 1 and the second electrode 2 are used. An electron flow source E is connected between the first ferromagnetic layer 1 and the first electrode 1M, while a voltage measuring circuit (means) V is connected between the second ferromagnetic layer 2 and the second electrode 2M.

An electron flow is supplied from the electron flow source E between the first ferromagnetic layer 1 and the first electrode 1M. In this case, a spin current diffuses from the semiconductor crystal layer 3 immediately below the first ferromagnetic layer 1. The spin current is transmitted through the semiconductor crystal layer 3 as a channel layer and reaches to the side of the second ferromagnetic layer 2. According to the magnetic field B which is applied to spins during transmission of the spin current, the direction of the spins rotates and voltage between the second ferromagnetic layer 2 and the second electrode 2M fluctuates. The voltage is then measured by the voltage measuring circuit V. Thus, the magnitude of the magnetic field B introduced in the semiconductor crystal layer 3 can be measured.

In the spin transport type magnetic sensor having this structure, an air bearing surface (ABS) is formed with the YZ plane on the side of the negative direction of the X-axis. The magnetic field B is introduced to a main body 3A, which constitutes a channel of the semiconductor crystal layer 3, through the protruding part 3B from a magnetic recording medium facing to the air bearing surface. In the main body 3A of the semiconductor crystal layer, polarized spins rotate.

The semiconductor crystal layer 3 comprises the main body 3A and the protruding part 3B. The main body 3A has a rectangular prism shape having a longitudinal direction in the Y-axis direction, a latitudinal direction in the X-axis and a thickness direction in the Z-axis. The planar shape of the protruding part 3B is a trapezoidal prism. The trapezoid has an upper base at an intersection of the air bearing surface with the XY plane, and its hypothetical bottom base may be a border with the main body 3A, although an actual bottom base does not exist because it is linked to the main body.

Output voltage depends on the magnitude of the magnetic field introduced in the semiconductor crystal layer 3, and the magnetic sensor function is provided. As the semiconductor crystal layer is bulk, its crystallinity is higher than that of a semiconductor crystal layer of a SOI substrate prepared by crystal growth. Accordingly, spin transport properties can be improved, allowing more accurate measurements.

As described above, the semiconductor crystal layer 3 has the protruding part 3B whose tip exists on the side of the air bearing surface of a magnetic head. In this case, the magnetic field can be introduced to the semiconductor crystal layer 3 through the protruding part 3B.

The main body 3A which constitutes the semiconductor crystal layer 3 other than the protruding part 3B is surrounded by the magnetic shield SH (including 10B) about the Y-axis, so that it is less affected by the magnetic field. Thus, the magnetic sensor further comprises the magnetic shield SH having a through-hole TH in which the protruding part 3B exists (see FIG. 14). The through-hole TH is located on the side face (the negative direction of the X-axis) of the semiconductor crystal layer 3 corresponding to a region between the first ferromagnetic layer 1 and the second ferromagnetic layer 2. The through-hole TH in the air bearing surface may have for example 0.005 μm to 0.1 μm on a side (length in the Y-axis direction) and for example 0.001 μm to 0.1 μm on the other side (length in the Z-axis direction). As the magnetic shield SH (particularly the lateral magnetic shield SH1: see FIG. 12) is located on the side face of the semiconductor crystal layer 3, the magnetic field is only introduced from the protruding part 3B, allowing accurate measurements.

Materials for each component are now described.

The lower base substrate 10A is made of a material having high insulation properties such as AlTiC, $Al_2O_3$ or Si.

The magnetic shield SH including the lower magnetic shield 10B is made of a soft magnetic substance such as alloys containing Ni and Fe, sendust alloys, alloys containing Fe and Co, alloys containing Fe, Co and Ni and the like, which may be exemplified by NiFe. The thickness in the Z-axis direction of the lateral magnetic shield SH1 provided on the side face is higher than the thickness of the semiconductor crystal layer 3, which may be for example 0.02 μm to 1 μm. Similarly, the thicknesses of the upper magnetic shield SH2 and the lower magnetic shield 10B in the Z-axis direction may be respectively 0.02 μm to 1 μm.

The upper base substrate 10C is constituted by an insulating layer embedded in the lower magnetic shield 10B, and may be made of $SiO_2$, $SiN_x$, MgO or $Al_2O_3$. The lower magnetic shield 10B is constituted by a first magnetic shield 10B1 attached to the lower surface of the upper base substrate 10C and a second magnetic shield 10B2 attached to the side surface and has an L-shape in the XZ section.

The insulating film 4 may be formed with such materials as $SiO_2$, $SiN_x$, MgO or $Al_2O_3$ without limitation provided that it is an insulating film.

The semiconductor crystal layer 3 may be formed of a single crystal semiconductor of bulk or single domain and is preferably Si having less crystal defects. Other semiconductors such as Ge, compound semiconductors such as GaAs, AlGaAs, ZnO, diamond (C) or SiC, or graphene may also be employed. Among these, the semiconductor crystal layer 3 made of Si, Ge, GaAs or graphene is suitable because it is known that they can provide a single-domain crystal having good quality. Because semiconductors have long spin diffusion length, spins can be suitably accumulated in channels.

The first tunnel barrier layer 5A and second tunnel barrier layer 5B formed on the semiconductor crystal layer 3 are respectively constituted by an insulating layer of MgO, $Al_2O_3$, $SiO_2$, ZnO or $MgAl_2O_4$ having a thickness of 2 nm or less. These materials are advantageous due to high efficacy of spin injection and detection. In the present example, the first and second tunnel barrier layers 5A and 5B are an integrated insulating layer 5.

The first ferromagnetic layer 1 and the second ferromagnetic layer 2 are respectively made of such materials as metals selected from the group consisting of Cr, Mn, Co, Fe and Ni, alloys containing at least one element selected from the above group, or compounds containing one or more element selected from the above group and one or more element selected from the group consisting of B, C, N, Si and Ge.

For example, the ferromagnetic layers 1 and 2 are made of CoFe. These materials can suitably perform as spin injecting electrodes or spin receiving electrodes because they are ferromagnetic materials having high spin polarizability.

The first electrode 1M and the second electrode 2M are made of non-magnetic materials such as Au, Cu or Al.

The first and second tunnel barrier layers each may be constituted by a Schottky barrier formed at the interface of the semiconductor and a metal layer Schottky-contacting thereto.

The tunnel barrier layers constitute potential barriers having a thickness that allows tunneling of electrons, which is 2 nm or less according to the present example. Electrons can tunnel insulating films or Schottky barriers having a thickness of 2 nm or less. Insulating films are superior to Schottky barriers because the thickness thereof can be more easily controlled.

The thickness of the semiconductor crystal layer 3 is 0.4 nm or more and 70 nm or less. In this case, it is advantageous because background voltage can be lowered. Namely, it is advantageous to decrease the thickness of the semiconductor crystal layer 3 in the magnetic sensor. As in the case of conventional SOI substrates, a semiconductor crystal layer having a low thickness prepared on an insulating layer by crystal growth does not have sufficient crystallinity. On the other hand, when the bulk semiconductor crystal layer 3 having a low thickness is used, noise can be sufficiently reduced due to its high crystallinity.

The production method of the magnetic sensor is now described referring to FIGS. 2 to 14.

Figure 2:
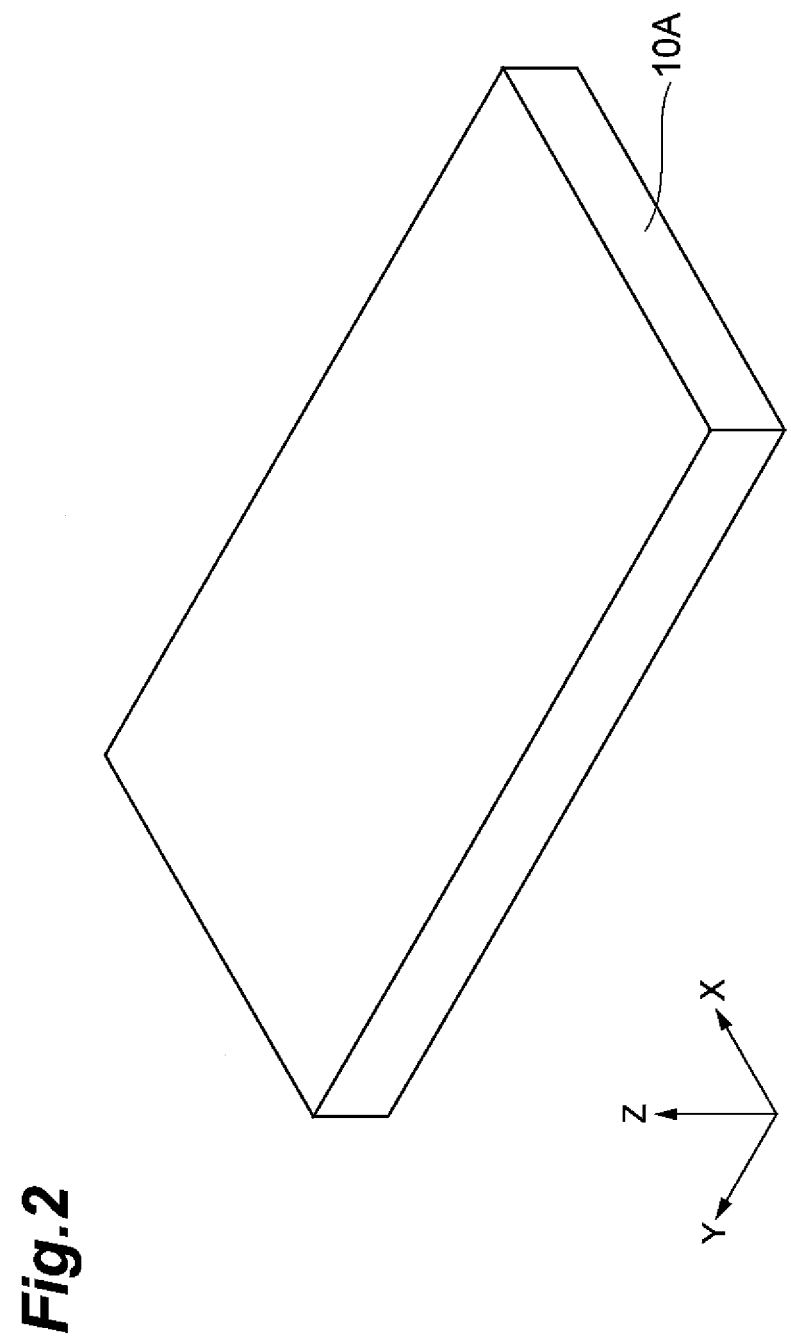
FIG. 2 is a perspective view of an intermediate state of the magnetic sensor in order to illustrate the production process.

First, as shown in FIG. 2, the lower base substrate 10A is prepared. In this example, the lower base substrate 10A is made of AlTiC. In this figure, the lower base substrate 10A in the form of a rectangular plate is shown, which is eventually obtained by dicing an initially prepared wafer having a diameter of 6 inches. A SOI substrate may be used as the lower base substrate 10A. The lower base substrate 10A is provided with an appropriate alignment mark, which is used as a basis for the subsequent patterning.

Figure 3:
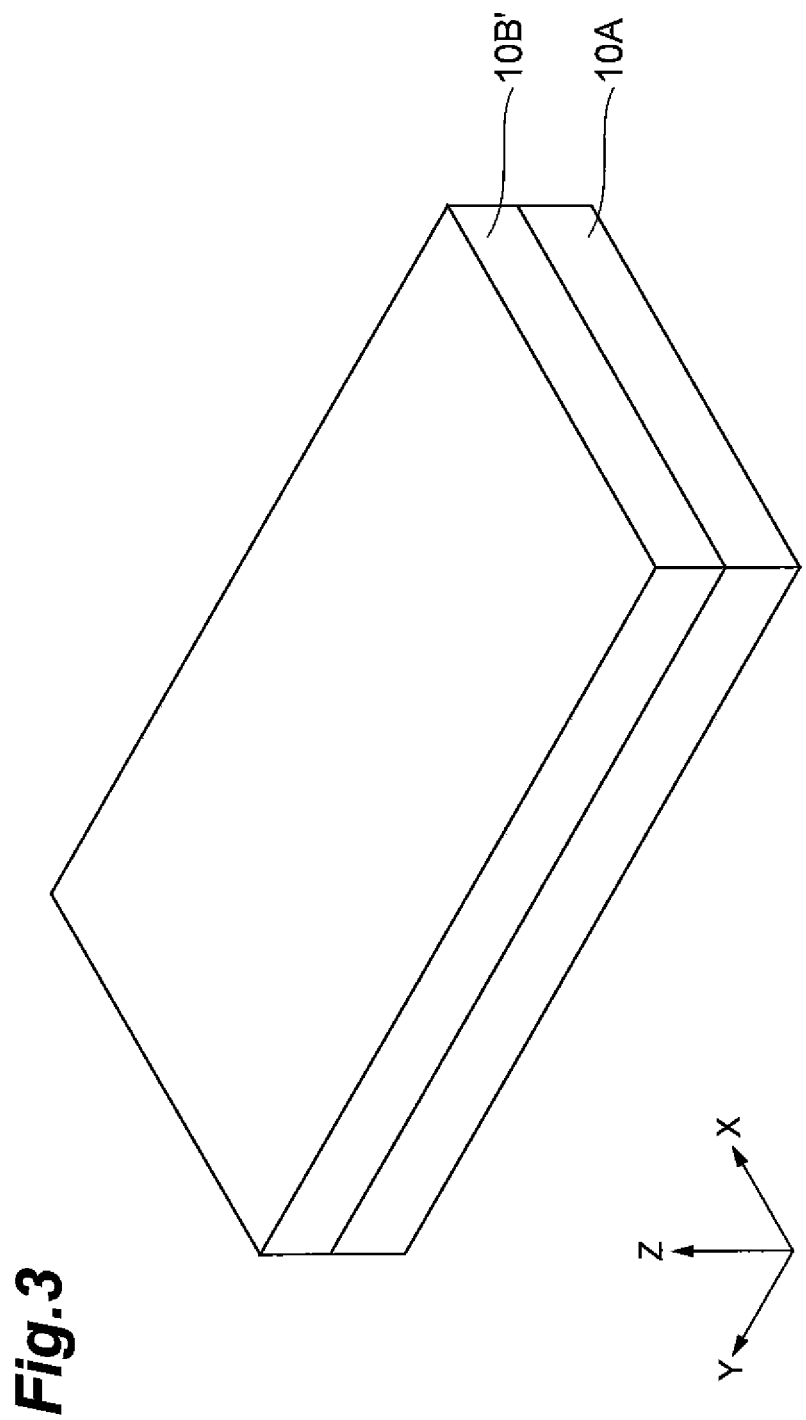
FIG. 3 is a perspective view of an intermediate state of the magnetic sensor in order to illustrate the production process.

Next, as shown in FIG. 3, a magnetic layer 10B' which serves as the lower magnetic shield 10B is formed on the lower base substrate 10A. The magnetic layer 10W is made of a soft magnetic substance, for example NiFe. It can be formed by sputtering.

Figure 4:
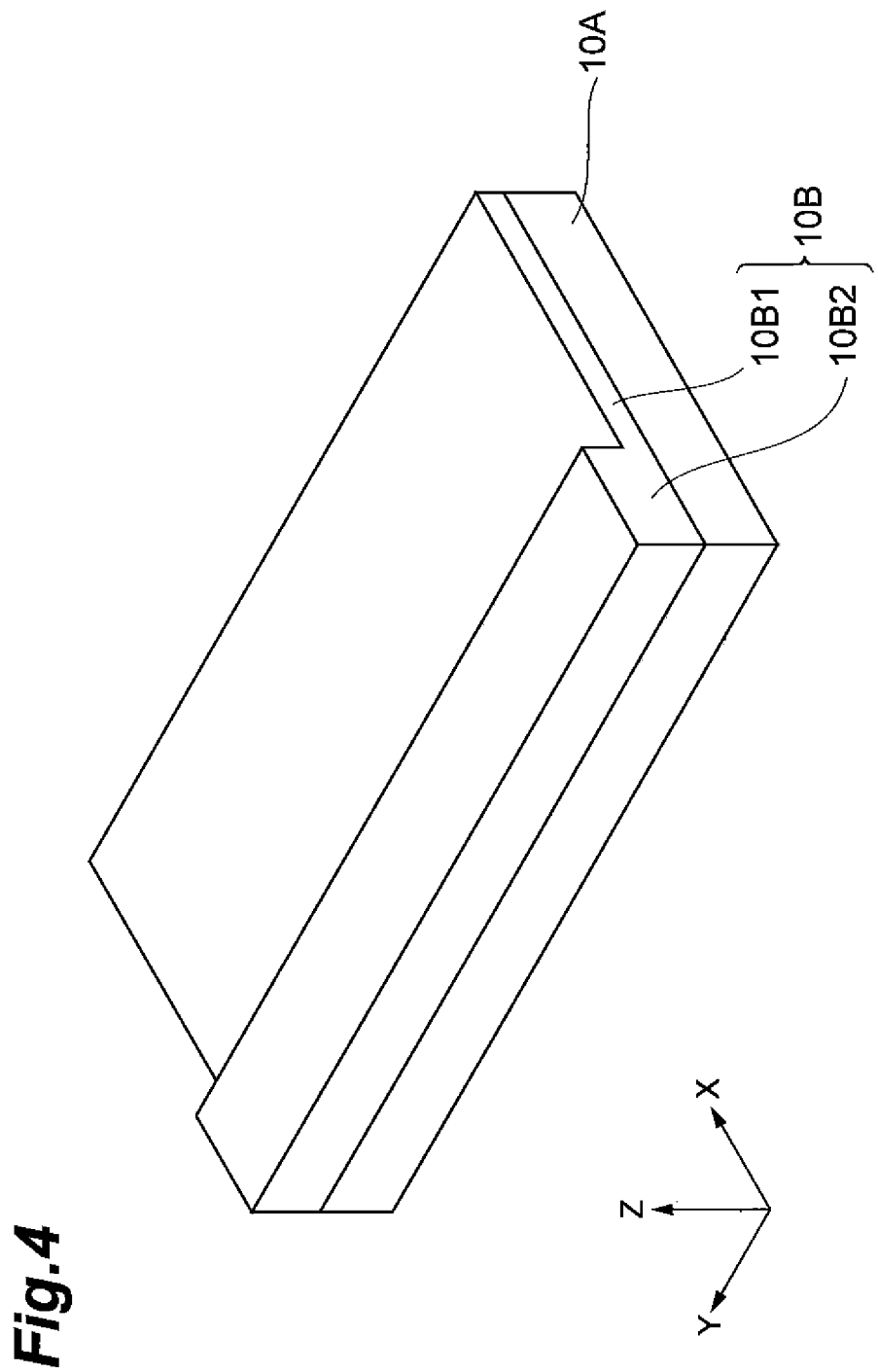
FIG. 4 is a perspective view of an intermediate state of the magnetic sensor in order to illustrate the production process.

Thereafter, as shown in FIG. 4, the magnetic layer 10B' is processed so that it has an L-shape in the XZ section, thereby forming a stairstep having a border along the Y-axis. This process may be carried out by ion milling using Ar or well-known reactive ion etching (RIE).

Figure 5:
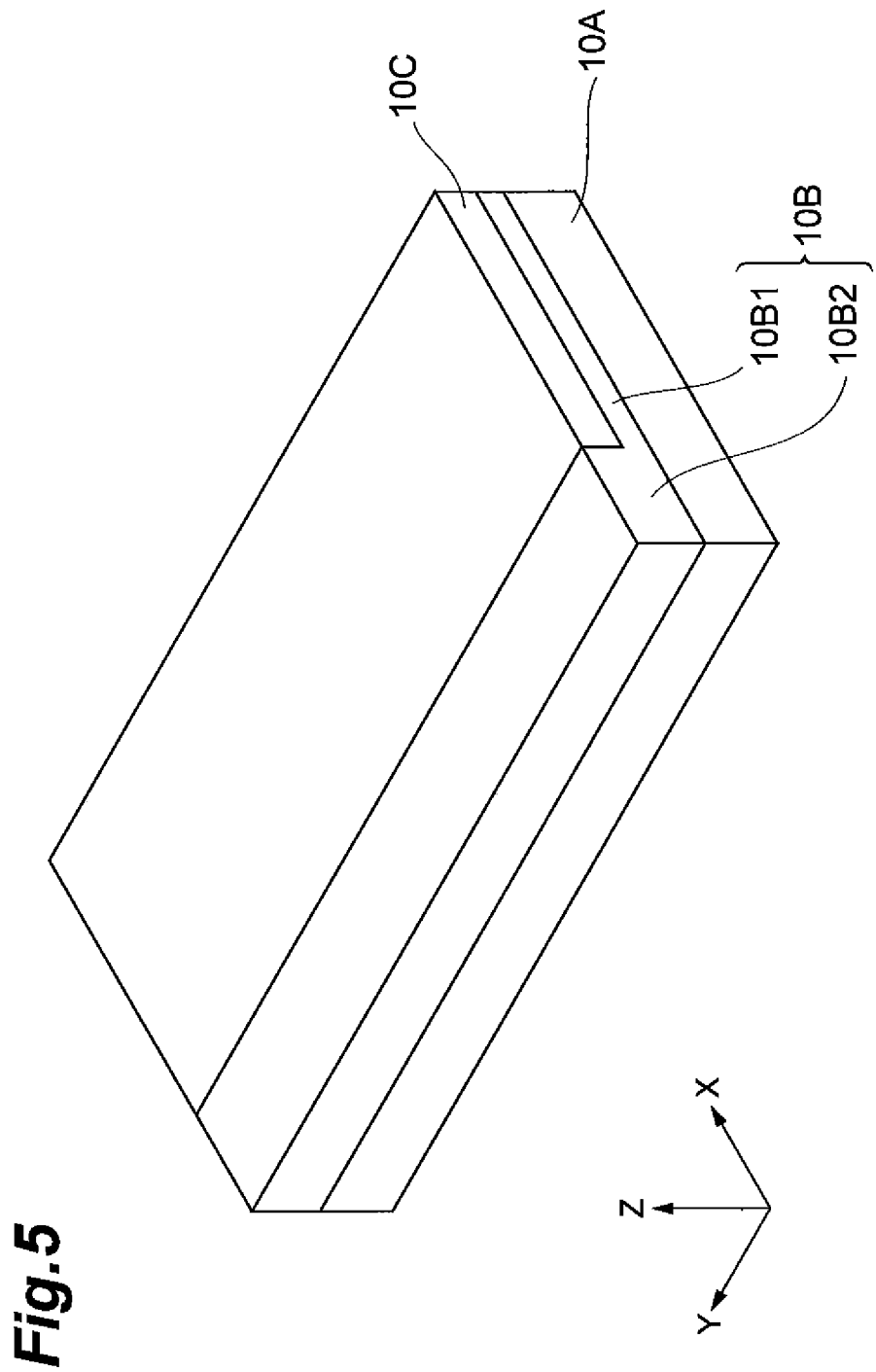
FIG. 5 is a perspective view of an intermediate state of the magnetic sensor in order to illustrate the production process.

As shown in FIG. 5, the upper base substrate 10C constituted by an insulating material is formed on the whole upper surface of the lower magnetic shield 10B, and the upper base substrate 10C constituted by an insulating material is subjected to chemical mechanical polishing (CMP) using a polishing member having a polishing surface parallel to the XY plane until the surface of the second magnetic shield 10B2 is exposed and the exposed surface is subjected to planarization.

Figure 6:
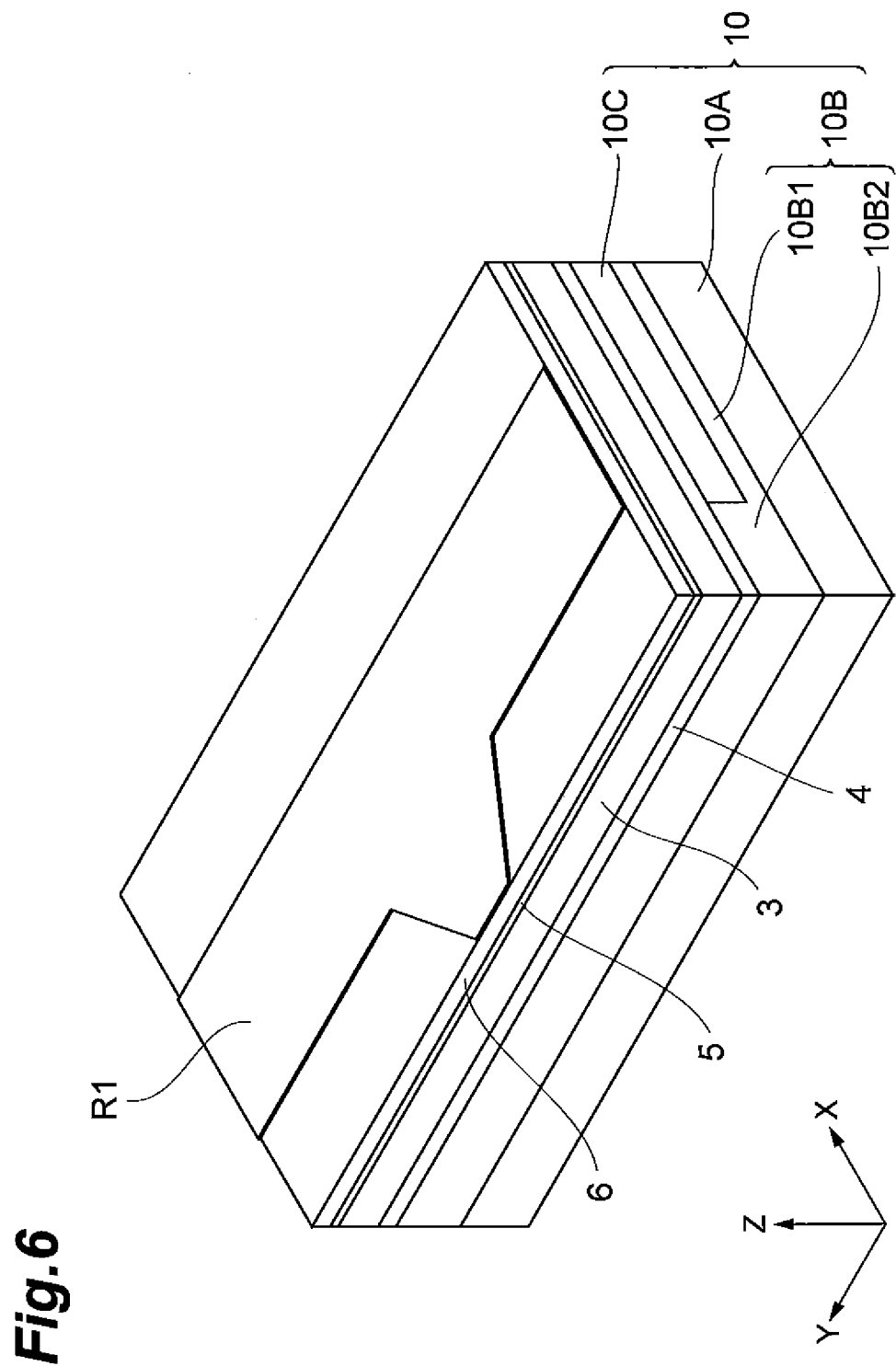
FIG. 6 is a perspective view of an intermediate state of the magnetic sensor in order to illustrate the production process.

Next, the bulk semiconductor crystal layer (semiconductor substrate) 3 for attachment is prepared. The semiconductor crystal layer 3 is a single crystal semiconductor substrate prepared by FZ or CZ method and is Si in the present example. The surface of the semiconductor crystal layer 3 (e.g. 100 nm of thickness) is subjected to thermal oxidation to form the insulating film 4 (e.g. 20 nm of thickness) made of $SiO_2$. The insulating film 4 may be formed by sputtering or chemical vapor deposition (CVD). The semiconductor crystal layer 3 is optionally diced so as to obtain an appropriate size and is attached to the surface of the base substrate 10 as shown in FIG. 6.

The base substrate 10 has on its outer most surface the upper base substrate 10C constituted by an insulating material and the semiconductor crystal layer 3 has the insulating layer 4 on its surface. These insulating materials are brought into contact and subjected under heat and pressure to bond the base substrate 10 to the semiconductor crystal layer 3.

In addition, the exposed surface of the semiconductor crystal layer 3 is cleaned. So-called RCA cleaning can be used. In RCA cleaning, an aqueous solution of hydrogen fluoride (HF), then ammonia ($NH_4OH$)+hydrogen peroxide ($H_2O_2$), and then hydrochloric acid (HCl)+hydrogen peroxide ($H_2O_2$) are contacted to the exposed surface, and finally washing with pure water is carried out.

Figure 19:
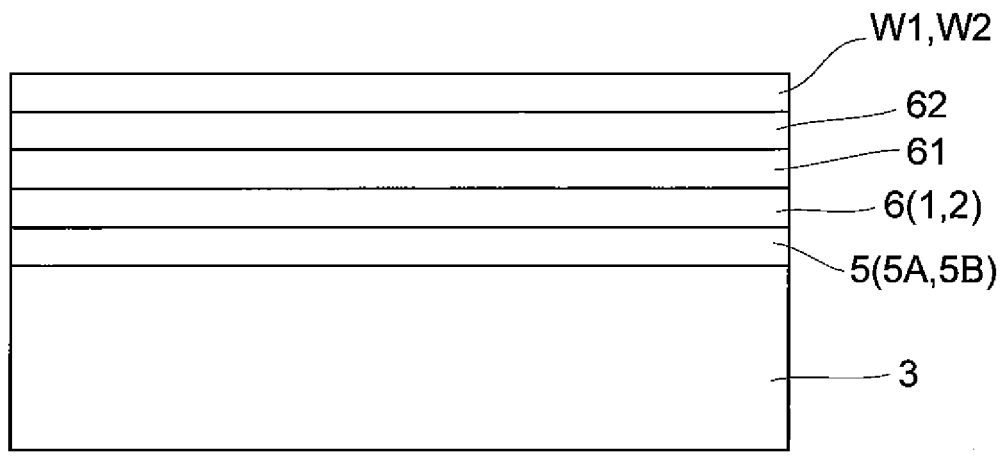
FIG. 19 is a sectional view of layers formed on a semiconductor crystal layer.

Thereafter, on the surface of the semiconductor crystal layer 3 is formed the tunnel barrier layer 5 of MgO (1 nm to 1.5 nm) by molecular beam epitaxy (MBE), Fe (5 nm to 10 nm) is formed on the tunnel barrier layer 5, onto which a Ti layer (3 nm) is formed. A CoFe layer, a Ru layer and a CoFe layer are formed thereon in this order to form the ferromagnetic layer 6. Optionally, an antiferromagnetic layer (IrMn) 61 is formed on the outermost CoFe layer of the ferromagnetic layer 6 (see FIG. 19), and a Ru layer and a Ta layer are formed on the antiferromagnetic layer 61 as a barrier layer 62 (see FIG. 19), although they are not shown in FIG. 6 for simplification.

In order to fix the magnetization direction of the ferromagnetic layer 6, annealing is then carried out while applying a magnetic field. For example, the magnetization direction is fixed to the negative direction of the Y-axis.

Figure 7:
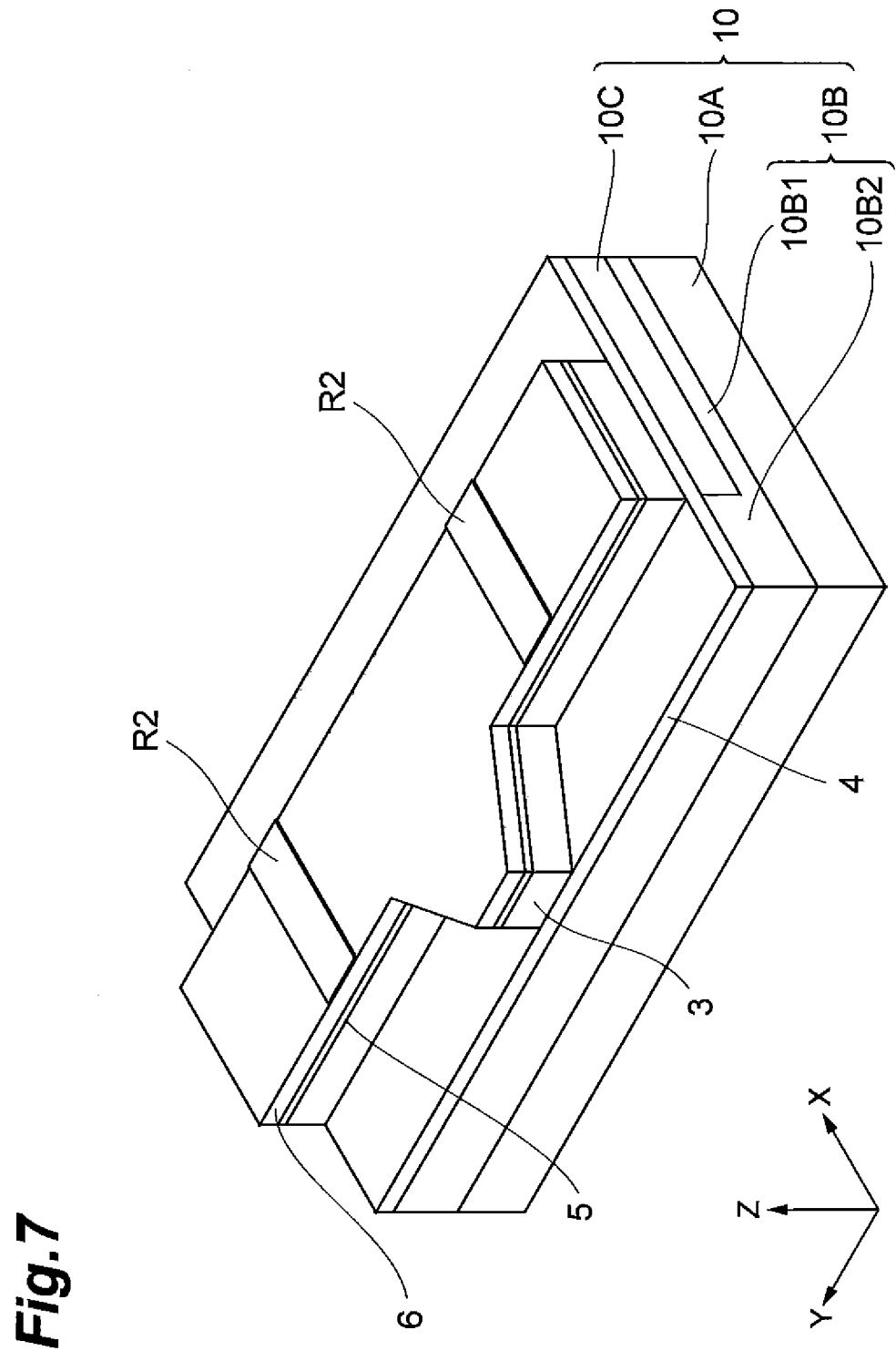
FIG. 7 is a perspective view of an intermediate state of the magnetic sensor in order to illustrate the production process.

As shown in FIG. 6, a photoresist is applied before carrying out patterning to obtain a mask R1 on the ferromagnetic layer 6 (barrier layer). By means of the mask R1, the regions of the layers 6, 5 and 3 which are not covered with the mask R1 are removed by ion milling to expose the insulating film 4 as shown in FIG. 7. Chemical etching can also be used with ion milling.

Thereafter, an insulating film (20 nm of thickness: not shown) is formed so as to cover the side face of the exposed semiconductor crystal layer 3 before removing the mask R1.

As shown in FIG. 7, a photoresist is applied before carrying out patterning to obtain a second mask R2 on the ferromagnetic layer 6 (barrier layer). The mask R2 is formed of a pair of regions extended in the X-axis direction. By means of the mask R2, the exposed region of the ferromagnetic layer 6 (barrier layer) is removed by ion milling or chemical etching so as to expose the tunnel barrier layer 5. Then, after an insulating film (20 nm of thickness: not shown) for covering the exposed semiconductor crystal layer 3 is formed, the mask R2 is removed.

Figure 8:
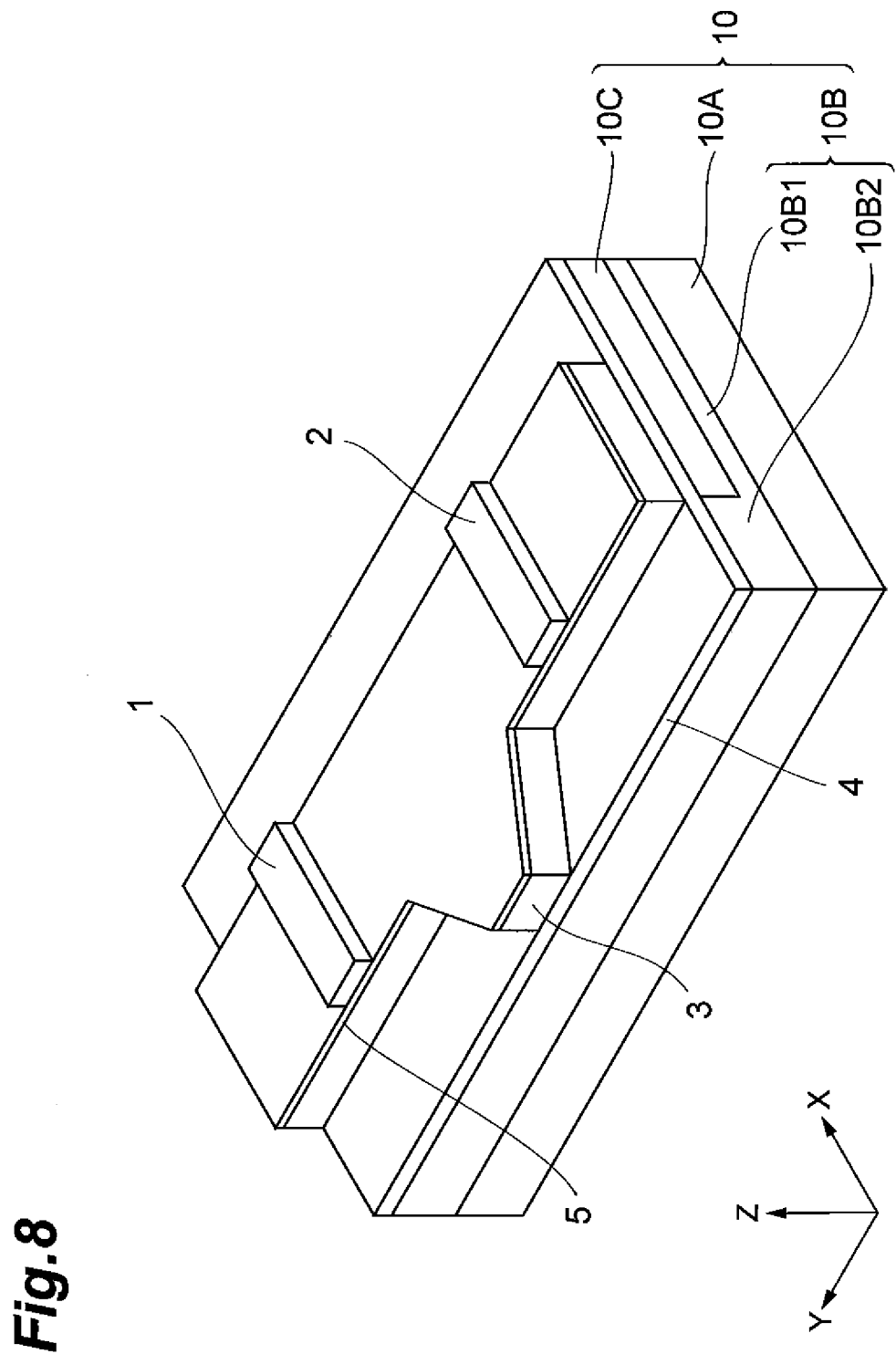
FIG. 8 is a perspective view of an intermediate state of the magnetic sensor in order to illustrate the production process.
Figure 9:
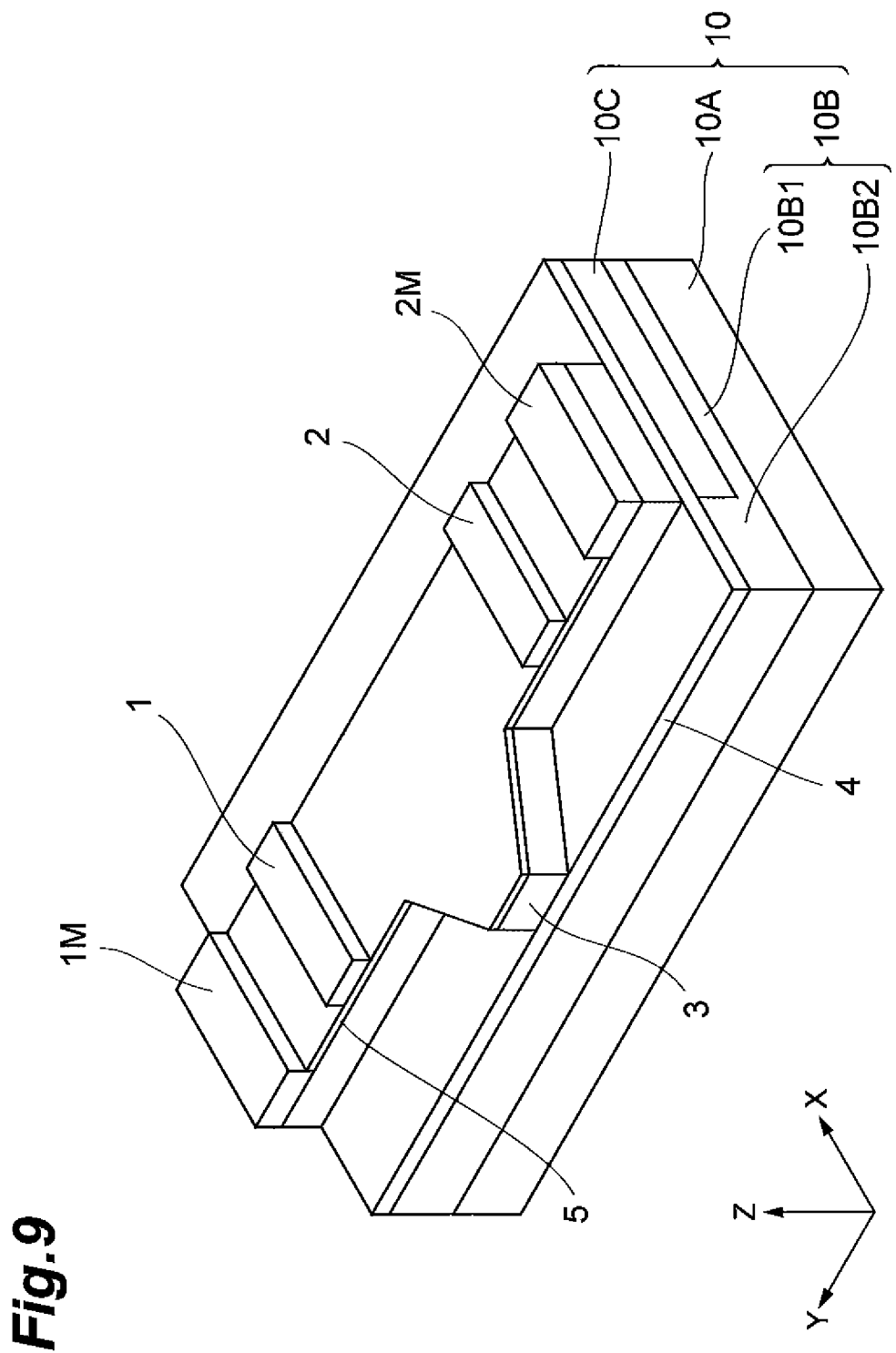
FIG. 9 is a perspective view of an intermediate state of the magnetic sensor in order to illustrate the production process.

As shown in FIG. 8, the remained ferromagnetic layers serve as the first ferromagnetic layer 1 and the second ferromagnetic layer 2. The removal may be carried out until the semiconductor crystal layer 3 is exposed. When the spin current detection is carried out, the tunnel barrier layer or the tunnel barrier layer and the insulating film adjacent to the first ferromagnetic layer 1 and the second ferromagnetic layer 2, in case the insulating film is exposed and remained are removed by patterning and etching using a photoresist, and as shown in FIG. 9, the first electrode 1M and the second electrode 2M are formed on the exposed semiconductor crystal layer 3 by for example sputtering or vapor deposition.

Figure 10:
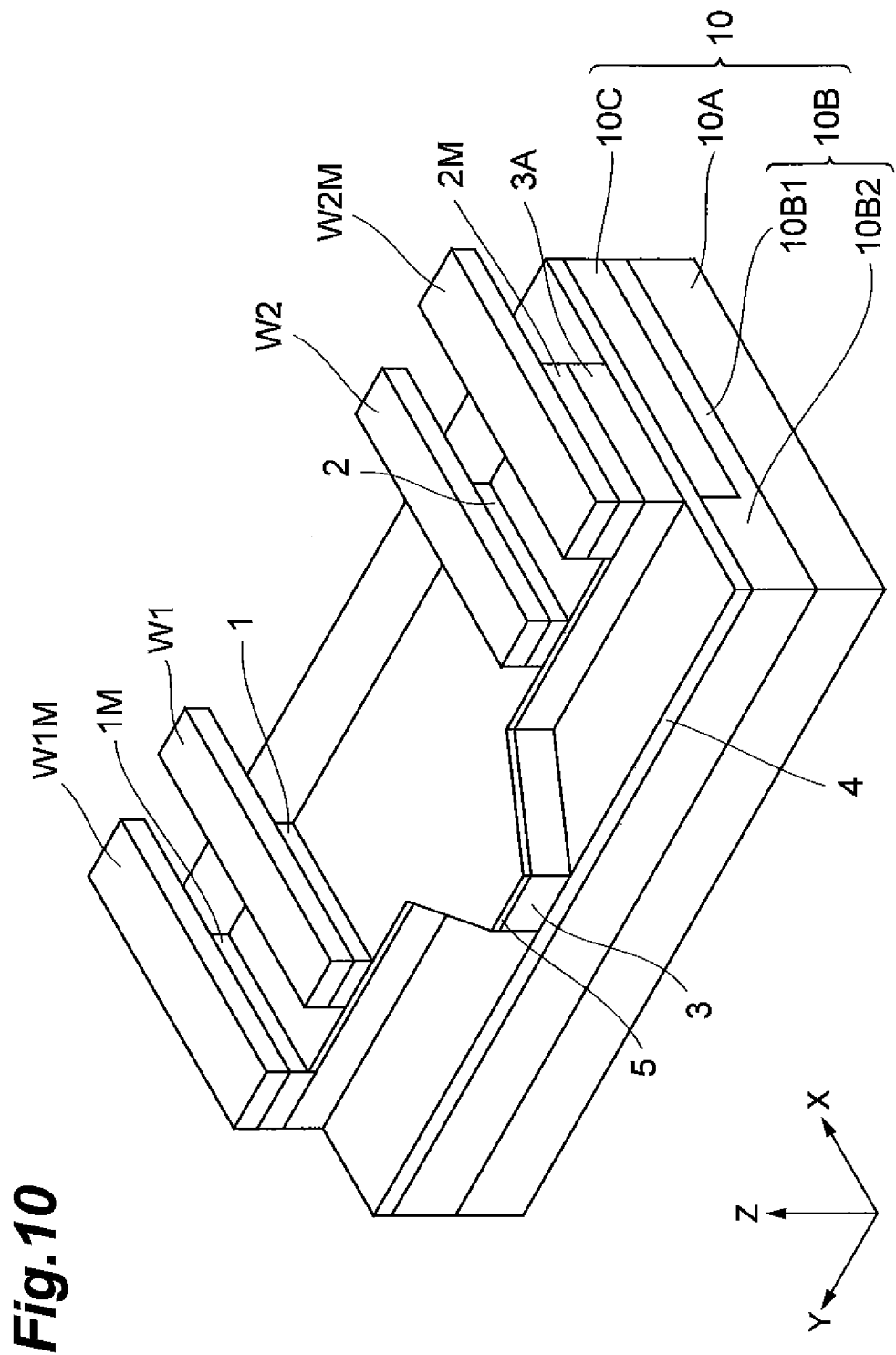
FIG. 10 is a perspective view of an intermediate state of the magnetic sensor in order to illustrate the production process.

Four electrode pads (not shown) are formed by vapor deposition and the like at a position distant from the semiconductor crystal layer 3 on the base substrate 10. As shown in FIG. 10, these electrode pads are connected to the first ferromagnetic layer 1, the second ferromagnetic layer 2, the first electrode 1M and the second electrode 2M respectively with wires W1, W2, W1M and W2M. Namely, one end of the wires W1, W2, W1M and W2M is electrically and physically connected to the layers 1, 2, 1M and 2M, respectively, as shown in FIG. 10.

Figure 11:
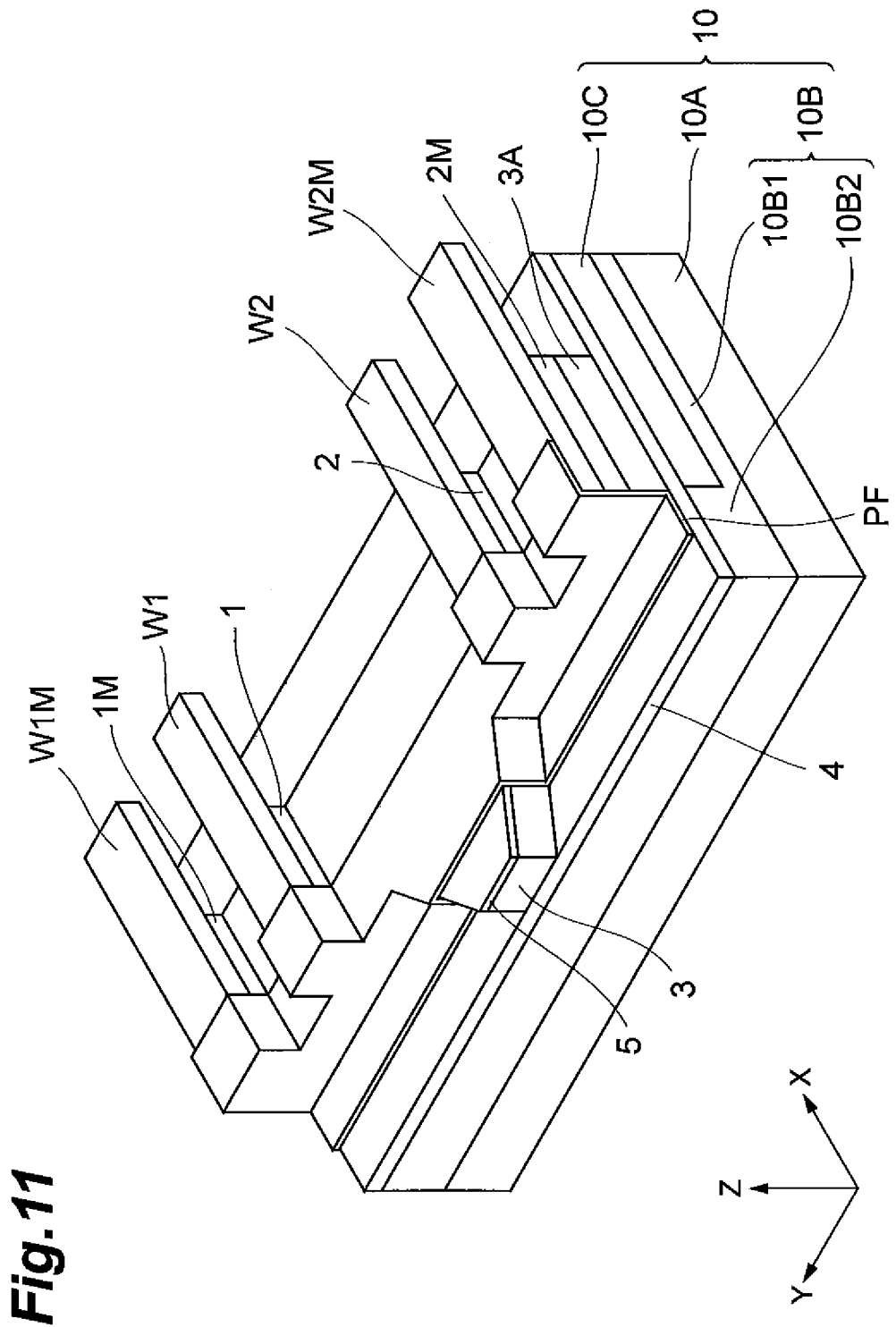
FIG. 11 is a perspective view of an intermediate state of the magnetic sensor in order to illustrate the production process.

As shown in FIG. 11, an insulating film PF having a thickness of 20 nm is formed by liftoff process so as to cover the surfaces on the side of the air bearing surface of the ferromagnetic layers 1 and 2 and the electrodes 1M and 2M. This is done in order to prevent the electrical contact of the lateral magnetic shield layer SH1 with the ferromagnetic layers 1 and 2 and the electrodes 1M and 2M in the next step. The insulating film PF is made of for example $SiO_2$.

Figure 12:
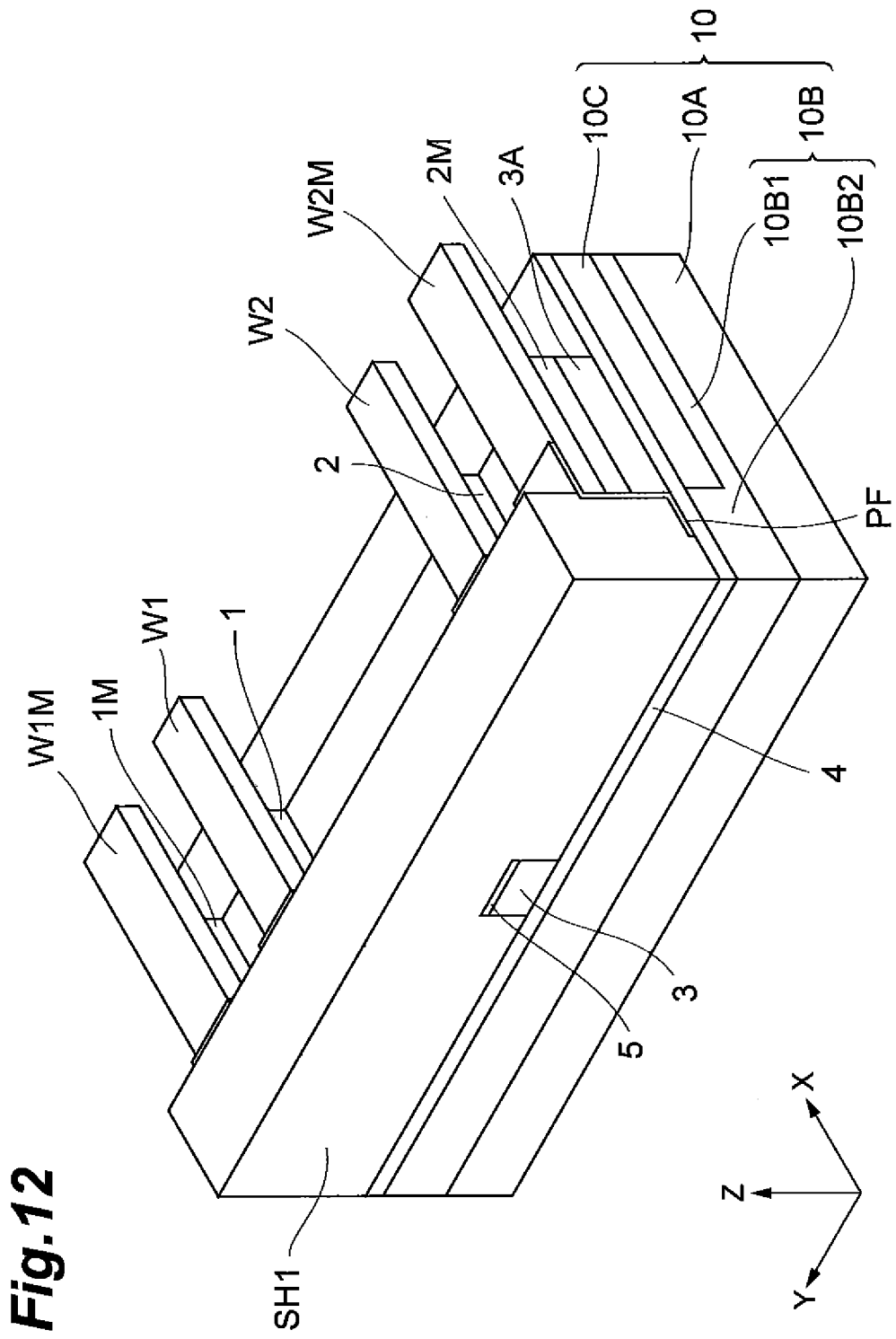
FIG. 12 is a perspective view of an intermediate state of the magnetic sensor in order to illustrate the production process.

As shown in FIG. 12, the surface of the insulating film 4 on the side of the air bearing surface except for the area where the protruding part 3B is formed is covered with the lateral magnetic shield layer SH1 extended along the Y-axis. The lateral magnetic shield layer SH1 is formed on top of the second magnetic shield 10B2 via the insulating film 4. The lateral magnetic shield layer SH1 may be formed by forming a mask pattern having an opening only at the area where this layer is formed by photoresist on the substrate, depositing a soft magnetic substance constituting the lateral magnetic shield in the opening and then removing the photoresist. The soft magnetic substance can be deposited by sputtering.

Figure 13:
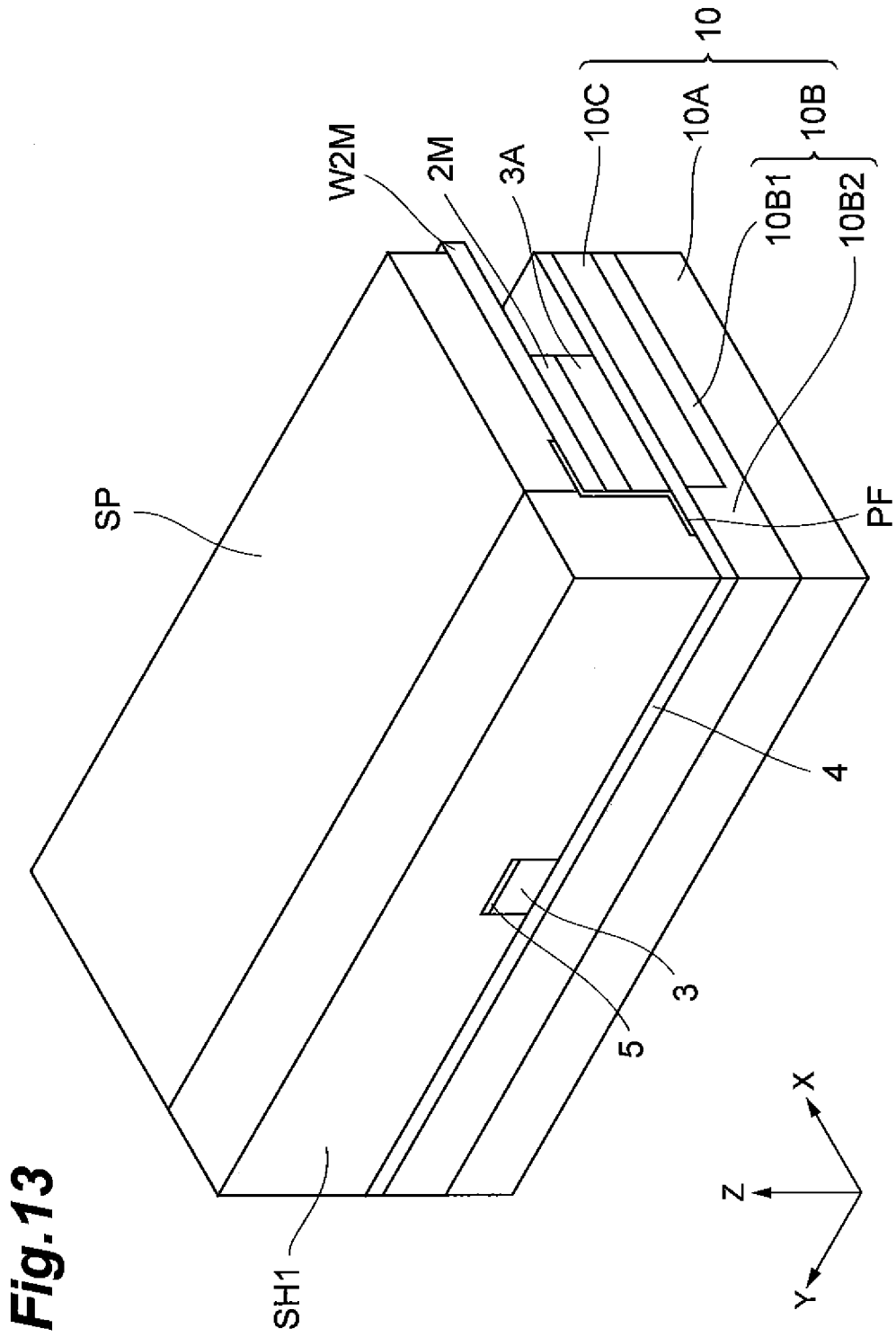
FIG. 13 is a perspective view of an intermediate state of the magnetic sensor in order to illustrate the production process.

As shown in FIG. 13, an optional insulating film SP as a spacer is then formed on the exposed substrate by sputtering in order to cover all wires, and the exposed surface of the insulating film SP is subjected to chemical mechanical polishing for planarization. It is preferable that the lateral magnetic shield SH1 has the same height in the Z-axis direction as the insulating film SP.

Figure 14:
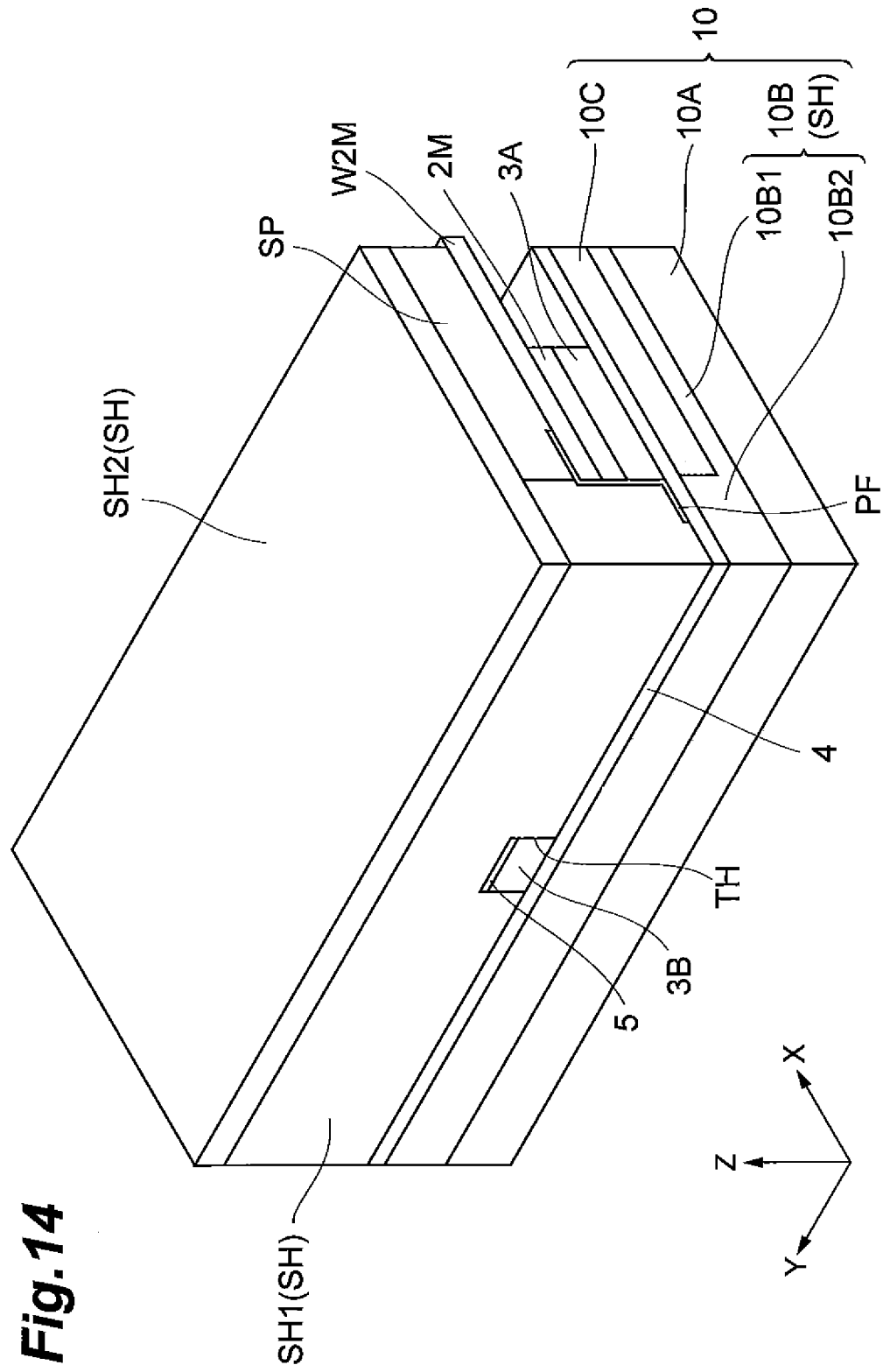
FIG. 14 is a perspective view of a magnetic sensor.

As shown in FIG. 14, on the exposed surface in the positive direction of the Z-axis of the lateral magnetic shield SH1 and the insulating film SP, the upper magnetic shield SH2 is formed. This may be carried out by sputtering. By the above steps, the magnetic sensor is obtained. The magnetic shields 10B, SH1 and SH2 are magnetic shield layers, thus they have a certain thickness.

Figure 15:
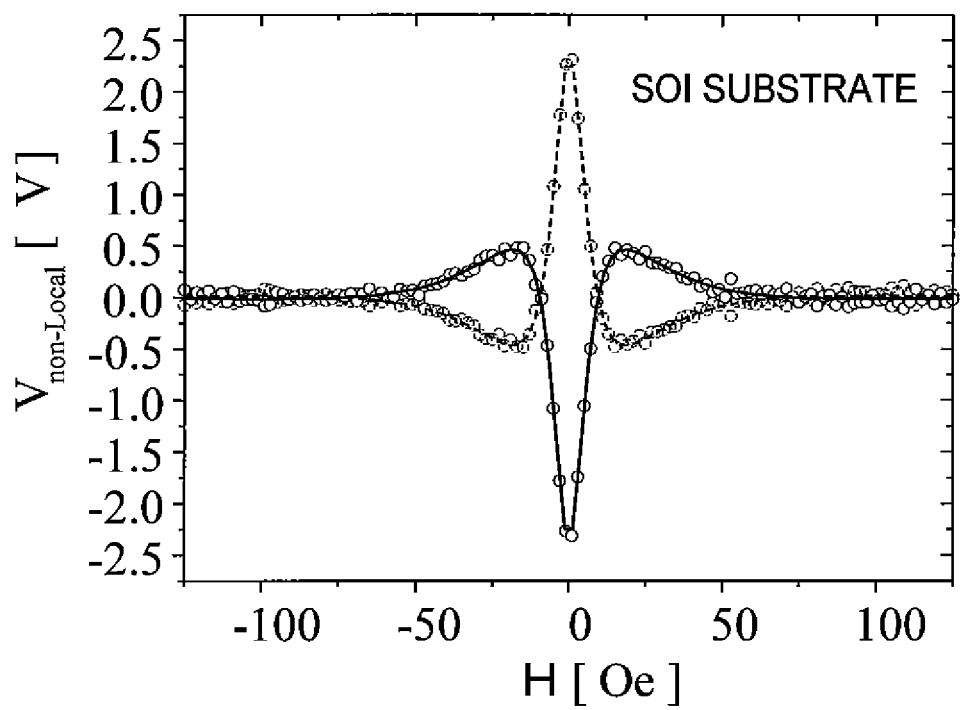
FIG. 15 is a graph showing the relation between an external magnetic field (Oe) and voltage $V_{non-Local}$ ($\mu V$)

FIG. 15 is a graph showing the relation between an external magnetic field (Oe) and voltage $V_{non-Local}$ (μV) in the spin current type magnetic sensor of the example according to the present aspect (an example where an attached-type SOI substrate was used). The semiconductor crystal layer 3 used was prepared by CZ method (P doping, $1 \times 20 \text{ cm}^{-3}$) and the magnetic shield, the tunnel barrier layer and the insulating film used were respectively NiFe, MgO and $SiO_2$.

Distance between the first ferromagnetic layer and the first electrode: 50 μm

Distance between the second ferromagnetic layer and the second electrode: 50 μm

Figure 16:
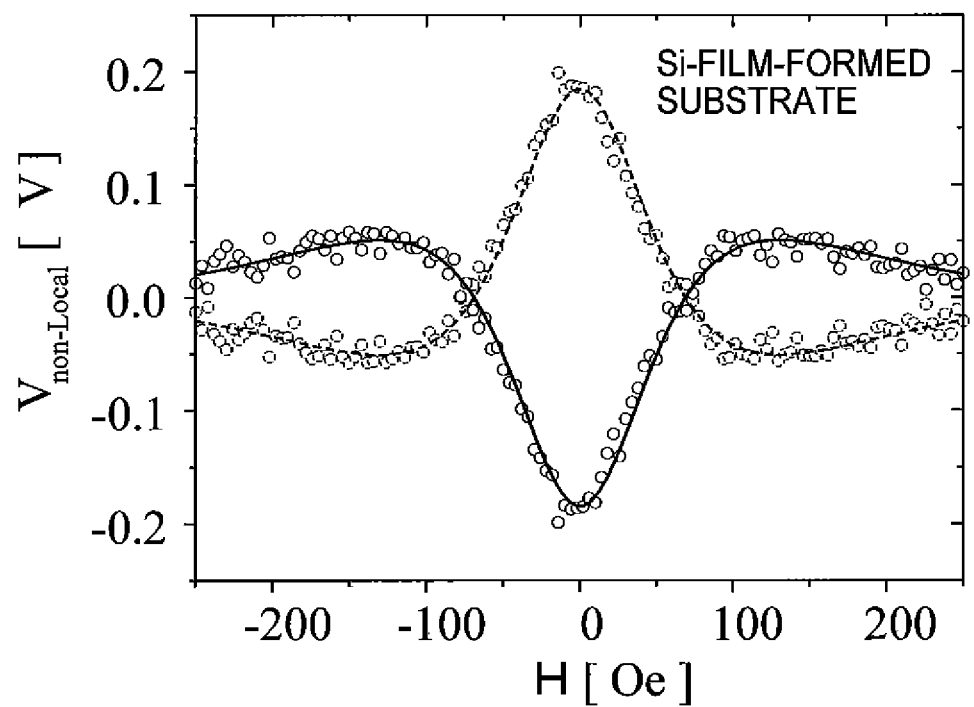
FIG. 16 is a graph showing the relation between an external magnetic field (Oe) and voltage $V_{non-Local}$ ($\mu V$)

Distance between the first ferromagnetic layer and the second ferromagnetic layer: 1 μm Thickness of the semiconductor crystal layer 3: 50 nm Length of the protrusion of the protruding part 3B from the main body 3A in the X-axis direction: 100 nm Dimension in the Y-axis direction of the protruding part 3B on the air bearing surface: 50 nm Dimension in the Z-axis direction of the protruding part 3B on the air bearing surface: 40 nm Thickness of the tunnel barrier layer: 1 nm Electric current applied between the first electrode and the first ferromagnetic layer: 1 mA Distance d between centers of the first ferromagnetic layer and the second ferromagnetic layer: 3.6 μm Spin diffusion length LN: 2.15 μm Spin lifetime t: 9.2 nsec FIG. 16 is a graph showing output characteristics of the spin current type magnetic sensor of the comparative example prepared in the similar manner as the above example except that on the upper base substrate 10C constituted by an insulating material, a semiconductor crystal layer having the same dimensions is formed by MBE method (solid source: Si, growth temperature: 500° C.) (an example where a Si film formed substrate was used).

Distance between the first ferromagnetic layer and the first electrode: 50 μm

Distance between the second ferromagnetic layer and the second electrode: 50 μm

Distance between the first ferromagnetic layer and the second ferromagnetic layer: 1 μm Thickness of the semiconductor crystal layer 3: 50 nm Length of the protrusion of the protruding part 3B from the main body 3A in the X-axis direction: 100 nm Dimension in the Y-axis direction of the protruding part 3B on the air bearing surface: 50 nm Dimension in the Z-axis direction of the protruding part 3B on the air bearing surface: 40 nm Thickness of the tunnel barrier layer: 1 nm Electric current applied between the first electrode and the first ferromagnetic layer: 1 mA Distance d between centers of the first ferromagnetic layer and the second ferromagnetic layer: 1.3 μm Spin diffusion length LN: 0.52 μm Spin lifetime t: 0.86 nsec This graph shows the relation between an external magnetic field (Oe) and voltage $V_{non-Local}$ (μV) in the magnetic sensor. In FIGS. 15 and 16, the results are shown which are obtained when the magnetization directions of the first ferromagnetic layer 1 and the second ferromagnetic layer 2 are parallel (dashed line) and anti-parallel (solid line). The result in FIG. 15 is obtained when the bulk substrate is attached according to the present example and FIG. 16 shows the measurement of Hanle effect after crystal growth of Si by MBE method.

In the example, output is significantly changed in response to a small change in the magnetic field, showing that the magnetic sensor of the example is more sensitive than that of the comparative example. The semiconductor crystal layer 3 in the example is a single crystal of single domain, while it is not in the comparative example. The single-domain crystal layer was identified by cross sectional observation with a transmission electron microscopy (TEM).

Figure 17A:
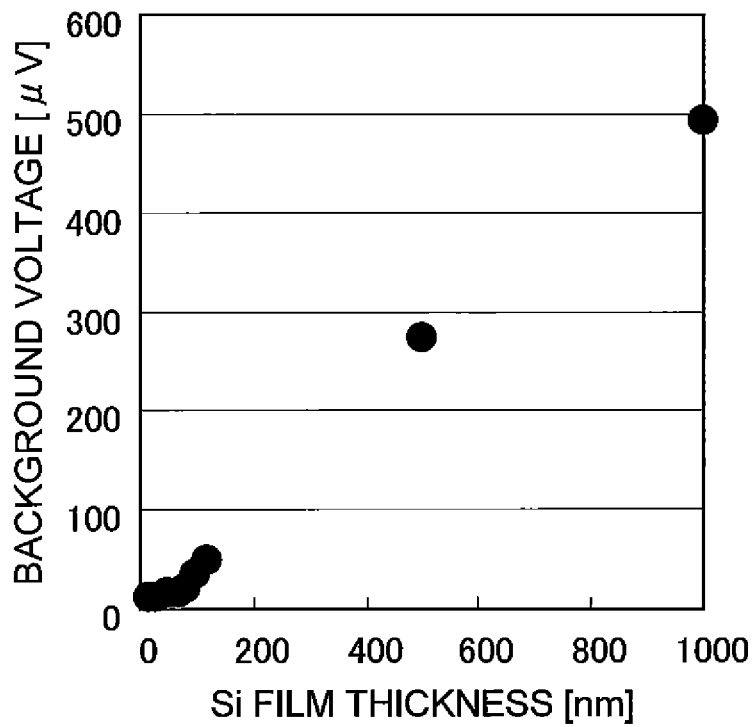
FIGS. 17A and 17B are graphs showing the relation between the thickness of a semiconductor crystal layer (Si film thickness) ($\mu m$) and background voltage ($\mu V$)
Figure 17B:
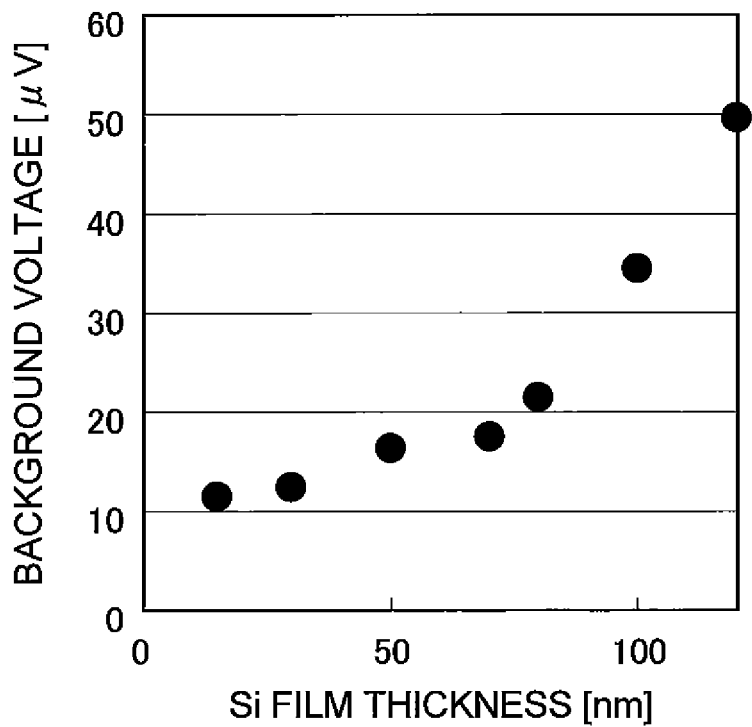

FIGS. 17A and 17B are graphs showing the relation between the thickness of the semiconductor crystal layer 3 (Si film thickness) (μm) and background voltage (μV) in the magnetic sensor according to the present example. The thickness of the semiconductor crystal layer 3 was variable, d was fixed to 1.3 μm and voltage V between the first electrode and the first ferromagnetic layer was fixed to 1V. When the thickness of the semiconductor crystal layer 3 is 70 nm or less, background voltage can be kept low. It was confirmed that when the thickness is 15 nm or more, background voltage is low. Although background voltage is decreased with reduction in the thickness of the semiconductor crystal layer 3, considering the fact that extremely thin layer can not exist as a single crystal layer, the thickness is preferably 0.4 nm or more.

Figure 18:
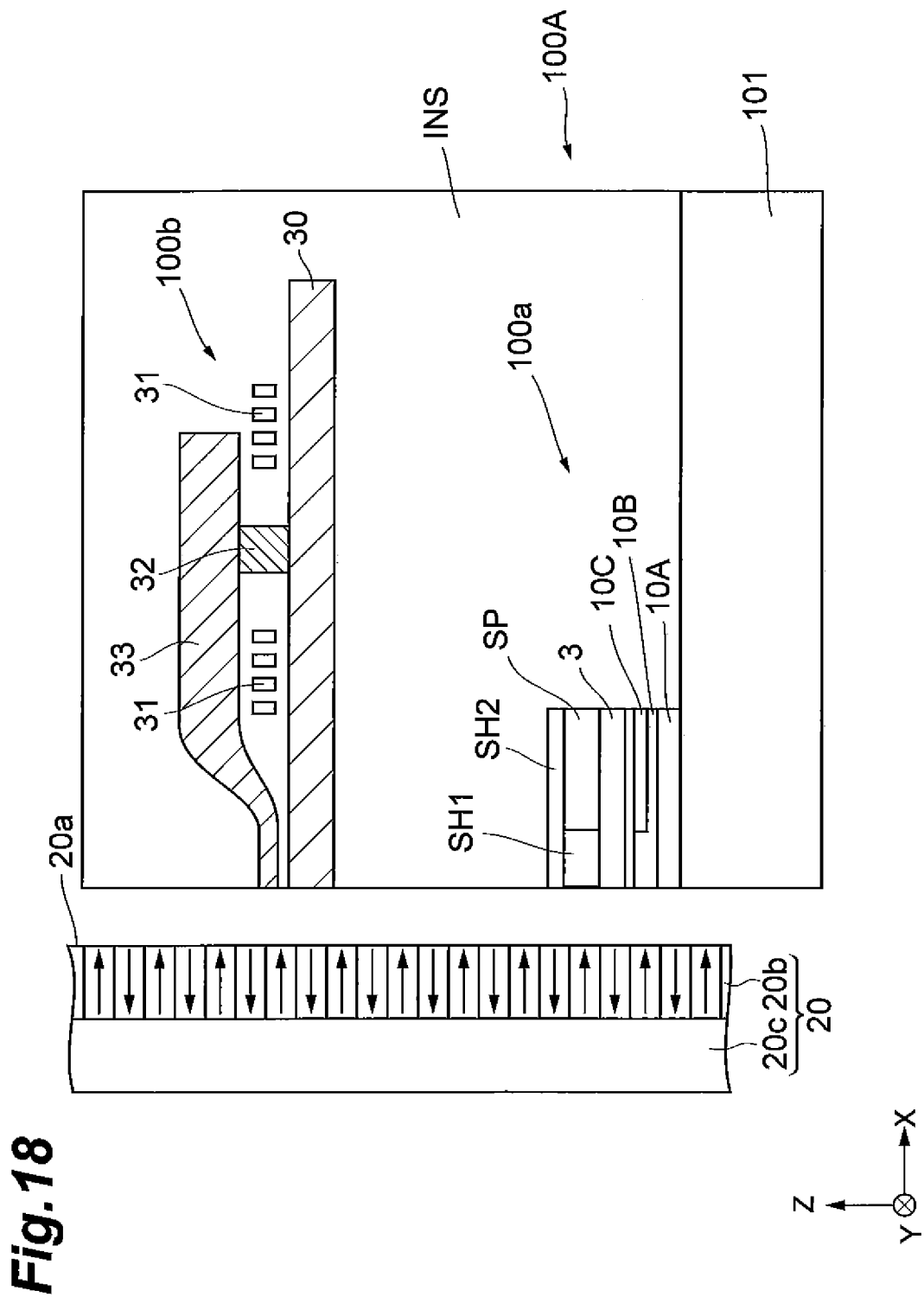
FIG. 18 is a vertical sectional view of a magnetic head comprising the magnetic sensor.

FIG. 18 is a vertical sectional view of a magnetic head comprising the magnetic sensor.

A magnetic recording medium 20 comprises a recording layer 20b having a recording surface 20a and a soft magnetic lining layer 20c stacked on the recording layer 20b, and proceeds along the Z-axis direction shown in FIG. 18 relative to the read/write thin film magnetic head 100A. The read/write thin film magnetic head 100A comprises, in addition to a read head 100a for reading data from the magnetic recording medium 20, a record head 100b for recording data on the magnetic recording medium 20. The read head 100a and the record head 100b are provided on a supporting substrate 101 and covered with a non-magnetic insulating layer INS such as alumina.

The above magnetic sensor (indicated as 100) is incorporated into the magnetic head. On the supporting substrate 101, the magnetic sensor 100 is formed as the read head, onto which the record head 100b for writing is formed via an insulating layer INS. The record head 100b comprises a contact part 32 and a main pole 33 on a return yoke 30, which form a path of magnetic flux. A thin film coil 31 is arranged so as to surround the contact part 32 and when recording current is applied in the thin film coil 31, magnetic flux is released from the tip of the main pole 33, so that data can be recorded in the recording layer 20b of the magnetic recording medium 20 such as a hard disk.

Any magnetization directions of the ferromagnetic layers may be used in either case of a non-localized arrangement utilizing a spin current alone or case of utilizing magnetoresistance effects. In the former case of non-localized arrangement, output results are the same between when the magnetization directions are parallel and anti-parallel. However, the magnetization directions of the first and second ferromagnetic layers are preferably parallel because it is easy to obtain parallel magnetization directions by heating the ferromagnetic layers with applying magnetic fields in the same direction during the production procedure. On the other hand, in the latter case of the arrangement utilizing magnetoresistance effects, the magnetization directions of the first and second ferromagnetic layers are preferably anti-parallel because a bigger output can be obtained than they are parallel.

The magnetization directions of the first ferromagnetic layer and the second ferromagnetic layer can be fixed by shape anisotropy of these layers (increasing an aspect ratio) or by exchange-coupling an antiferromagnetic layer to the ferromagnetic layer. The spin relaxation time in the semiconductor crystal layer 3 is 1 nsec or more.

In addition, the production method of the crystal layer 3 from graphene is described hereinafter. Graphene is a layer in which spins are accumulated by spin injection. Graphene is a sheet having a structure in which carbon atoms bond each other in a hexagonal meshed plane shape. It is possible to decrease the thickness of the semiconductor crystal layer 3 made of graphene as thin as possible, and magnetic flux can be selectively detected from extremely minute environment.

Such graphene can be obtained by, for example, exfoliation method or decomposition method. In the exfoliation method, for example, (A) highly oriented pyrolytic graphite (HOPG) is prepared. This highly oriented pyrolytic graphite (HOPG) is made of multiple single-layer graphene sheets stacked together and is a single crystal of a single domain. This is commercially available.

In addition, (B) a first exfoliation plate of a film substrate soluble in an organic solvent onto which a resist layer is applied, a second exfoliation plate having the same structure as the first exfoliation plate, a third exfoliation plate, a fourth exfoliation plate, ..., and a Nth exfoliation plate are prepared.

The resist layer on the film substrate is brought into contact with the HOPG under ordinary pressure, thereby the resist layer is attached to the HOPG. The HOPG and the first exfoliation plate are placed under vacuum, and the first exfoliation plate is peeled off from the HOPG, thereby exfoliating and leaving some layers of graphene sheets of the original HOPG on the resist layer.

While vacuum is maintained, the multiple graphene sheets remained on the first exfoliation plate are brought into contact with the resist layer of the second exfoliation plate and the first exfoliation plate is peeled off from the second exfoliation plate, thereby leaving the graphene sheets on the resist layer of the second exfoliation plate. This procedure of attachment and exfoliation under vacuum is repeated until a desired film thickness of the graphene sheets remained on the resist layer of the Nth exfoliation plate is obtained as observed under an optical microscope.

The graphene sheets attached on the resist layer of the Nth exfoliation plate is finally brought into contact with the insulating film 4 under vacuum before returning to ordinary pressure followed by dissolution of the film substrate in an organic solvent and dissolution and cleaning of the resist. Accordingly, the crystal layer made of graphene can be attached on the insulating film 4. It is preferable that one graphene layer is ultimately remained because it allows detection of the magnetic field from an extremely minute region.

In the decomposition method, for example, a SiC layer formed by CVD method and the like is optionally subjected to oxidation and hydrogen etching before desorption of silicon atoms by for example electron bombardment heating, thereby forming a graphene sheet on the SiC layer. When the decomposition method is used, a semiconductor substrate sliced from a SiC ingot is attached on an insulating film 4 by means of heat and pressure and the semiconductor substrate is applied for the decomposition method to form a graphene layer on the insulating film 4.

As described above, the present embodiment uses a single-domain crystal layer as a spin transport channel. Accordingly, the channel material may be other than Si in order to improve spin transport properties. However, semiconductors having a cubic diamond structure such as Si or a zincblende structure such as GaAs are preferable because many bulk crystals with good quality are produced and are commercially available.

What is claimed is:

1. A magnetic sensor comprising:
   a base substrate having a magnetic shield layer;
   a single-domain semiconductor crystal layer attached via an insulating film on the magnetic shield layer of the base substrate;
   a first ferromagnetic layer formed on top of the semiconductor crystal layer on the opposite side of the semiconductor crystal layer to the insulating film, via a first tunnel barrier layer; and
   a second ferromagnetic layer formed, at a distance from the first ferromagnetic layer, on top of the semiconductor crystal layer on the opposite side of the semiconductor crystal layer to the insulating film, via a second tunnel barrier layer.

2. The magnetic sensor according to claim 1 comprising:
   a first electrode which is provided on the semiconductor crystal layer on the opposite side of the semiconductor crystal layer to the insulating film and allows electrons to flow between the first electrode and the first ferromagnetic layer; and
   a second electrode which is provided on the semiconductor crystal layer on the opposite side of the semiconductor crystal layer to the insulating film and used for measuring voltage between the second ferromagnetic layer.

3. The magnetic sensor according to claim 1, wherein the semiconductor crystal layer is made of Si, Ge, GaAs or graphene.

4. The magnetic sensor according to claim 1, wherein the semiconductor crystal layer has a protruding part whose tip is located on the side of an air bearing surface of a magnetic head.

5. The magnetic sensor according to claim 4, further comprising, on the base substrate on the side of the air bearing surface, a magnetic shield having a through-hole in which the protruding part exists, and the through-hole is located on a side face of the semiconductor crystal layer corresponding to a region between the first ferromagnetic layer and the second ferromagnetic layer.

6. The magnetic sensor according to claim 1, wherein the first and second tunnel barrier layers are made of MgO, $Al_2O_3$, $SiO_2$, ZnO or $MgAl_2O_4$.

7. The magnetic sensor according to claim 1, wherein the first and second tunnel barrier layers are each formed of a Schottky barrier formed at an interface of the semiconductor substrate and a metal layer Schottky-contacting thereto.

8. The magnetic sensor according to claim 1, wherein the thickness of the semiconductor crystal layer is 0.4 nm or more and 70 nm or less.

9. The magnetic sensor according to claim 1, wherein magnetization directions of the first ferromagnetic layer and the second ferromagnetic layer are opposite to each other.

10. The magnetic sensor according to claim 2, wherein magnetization directions of the first ferromagnetic layer and the second ferromagnetic layer are the same.

11. The magnetic sensor according to claim 1, wherein the semiconductor crystal layer is formed of a semiconductor having a diamond structure or a zincblende structure.

* * * * *